US012666641B2

(12) United States Patent
Tai et al.

(10) Patent No.: US 12,666,641 B2
(45) Date of Patent: Jun. 23, 2026

(54) SEMICONDUCTOR DEVICE AND METHOD OF FABRICATING THE SAME

(71) Applicant: Taiwan Semiconductor Manufacturing Company, Ltd., Hsinchu (TW)

(72) Inventors: Cheng-You Tai, Taipei City (TW); Ling-Sung Wang, Hsinchu (TW); Chen-Chieh Chiang, Kaohsiung City (TW); Jung-Chi Jeng, Tainan City (TW); Po-Yuan Su, Kaohsiung City (TW); Tsung Jing Wu, Yunlin County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 377 days.

(21) Appl. No.: 18/350,742

(22) Filed: Jul. 11, 2023

(65) Prior Publication Data

US 2025/0022958 A1     Jan. 16, 2025

(51) Int. Cl.
 H10D 30/62 (2025.01)
 H10D 30/01 (2025.01)
 H10D 64/01 (2025.01)
 H10D 84/80 (2025.01)

(52) U.S. Cl.
 CPC ....... H10D 30/6211 (2025.01); H10D 30/024 (2025.01); H10D 30/6219 (2025.01); H10D 64/017 (2025.01); H10D 84/813 (2025.01)

(58) Field of Classification Search
 CPC ............. H10D 30/6211; H10D 64/017; H10D 30/024; H10D 30/6219; H10D 84/813
 See application file for complete search history.

(56) References Cited

U.S. PATENT DOCUMENTS

| | | | |
|---|---|---|---|
| 8,836,016 B2 | 9/2014 | Wu et al. | |
| 8,841,701 B2 | 9/2014 | Lin et al. | |
| 8,847,293 B2 | 9/2014 | Lee et al. | |
| 8,853,025 B2 | 10/2014 | Zhang et al. | |
| 8,962,400 B2 | 2/2015 | Tsai et al. | |
| 9,093,514 B2 | 7/2015 | Tsai et al. | |
| 9,236,267 B2 | 1/2016 | De et al. | |
| 9,245,805 B2 | 1/2016 | Yeh et al. | |
| 9,520,482 B1 | 12/2016 | Chang et al. | |
| 9,576,814 B2 | 2/2017 | Wu et al. | |
| 2013/0175666 A1* | 7/2013 | Tran .......................... | H10D 1/68 257/532 |
| 2015/0097220 A1* | 4/2015 | Ponoth ................. | H10D 84/813 257/296 |
| 2022/0238729 A1* | 7/2022 | Yang ...................... | H10D 1/047 |

* cited by examiner

*Primary Examiner* — Christine A Enad
(74) *Attorney, Agent, or Firm* — JCIPRNET

(57) ABSTRACT

A semiconductor device includes a substrate having fins and trenches in between the fins, a plurality of insulators, a first metal layer, an insulating layer, a second metal layer and an interlayer dielectric. The insulators are disposed within the trenches of the substrate. The first metal layer is disposed on the plurality of insulators and across the fins. The insulating layer is disposed on the first metal layer over the plurality of insulators and across the fins. The second metal layer is disposed on the insulating layer over the plurality of insulators and across the fins. The interlayer dielectric is disposed on the insulators and covering the first metal layer, the insulating layer and the second metal layer.

20 Claims, 18 Drawing Sheets

SEMICONDUCTOR DEVICE AND METHOD OF FABRICATING THE SAME

BACKGROUND

As the semiconductor devices keep scaling down in size, three-dimensional multi-gate structures, such as the fin-type field effect transistor (FinFET), have been developed to replace planar CMOS devices. A characteristic of the Fin-FET device lies in that the structure has one or more silicon-based fins that are wrapped around by the gate to define the channel of the device. The gate wrapping structure further provides better electrical control over the channel.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the critical dimensions of the various features may be arbitrarily increased or reduced for clarity of discussion.

DETAILED DESCRIPTION

Figure 1:
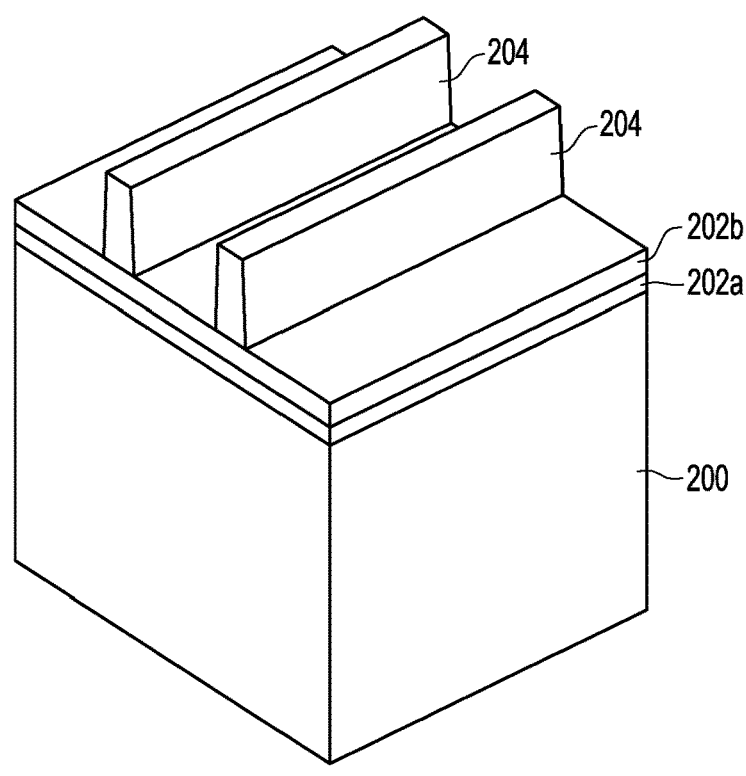
FIG. 1 to FIG. 12C are schematic views of various stages in a method of fabricating a semiconductor device in a capacitor region of the semiconductor device according to some exemplary embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "over", "overlying", "above", "upper" and the like, may be used herein for case of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

The embodiments of the present disclosure describe the exemplary manufacturing processes of a three-dimensional structure with height differences and the structure(s) fabricated there-from. Certain embodiments of the present disclosure describe the exemplary manufacturing processes of fin field-effect transistor (FinFET) devices and the FinFET devices fabricated there-from. The FinFET device may be formed on a monocrystalline semiconductor substrate, such as a bulk silicon substrate in certain embodiments of the present disclosure. In some embodiments, the FinFET device may be formed on a silicon-on-insulator (SOI) substrate or a GOI (germanium-on-insulator) substrate as alternatives. Also, in accordance with the embodiments, the silicon substrate may include other conductive layers, doped regions or other semiconductor elements, such as transistors, diodes or the like. The embodiments are intended to provide further explanations but are not used to limit the scope of the present disclosure.

In FinFET devices, when fabricating a capacitor structure, the doping uniformity is difficult to be controlled due to the 3D topography of the device. In general, uniformity or linearity of the doping can be improved by heavy doping, but this will induce device leakage, and decrease the process window. In some embodiments of the present disclosure, a capacitor structure is fabricated in a capacitor region of a semiconductor device, whereby the capacitor structure has improved linearity, uniformity, has less leakage and high capacitance, and the process window of the semiconductor device can be improved.

FIG. 1 to FIG. 12C are schematic views of various stages in a method of fabricating a semiconductor device in a capacitor region of the semiconductor device according to some exemplary embodiments of the present disclosure. It is to be noted that the process steps described herein cover a portion of the manufacturing processes used to fabricate a semiconductor device, such as a FinFET device.

As shown in FIG. 1, a semiconductor substrate 200 is provided. In one embodiment, the semiconductor substrate 200 comprises a crystalline silicon substrate (e.g., wafer). The semiconductor substrate 200 may comprise various doped regions depending on design requirements (e.g., p-type semiconductor substrate or n-type semiconductor substrate). In some embodiments, the doped regions may be doped with p-type or n-type dopants. For example, the doped regions may be doped with p-type dopants, such as boron or BF2; n-type dopants, such as phosphorus or arsenic; and/or combinations thereof. The doped regions may be configured for an n-type FinFET, or alternatively configured for a p-type FinFET. In some alternative embodiments, the semiconductor substrate 200 may be made of some other suitable elemental semiconductor, such as diamond or germanium; a suitable compound semiconductor, such as gallium arsenide, silicon carbide, indium arsenide, or indium phosphide; or a suitable alloy semiconductor, such as silicon germanium carbide, gallium arsenic phosphide, or gallium indium phosphide.

In one embodiment, a pad layer 202a and a mask layer 202b are sequentially formed on the semiconductor substrate 200. The pad layer 202a may be a silicon oxide thin film formed, for example, by thermal oxidation process. The pad layer 202a may act as an adhesion layer between the semiconductor substrate 200 and the mask layer 202b. The pad layer 202a may also act as an etch stop layer for etching the mask layer 202b. In at least one embodiment, the mask layer 202b is a silicon nitride layer formed, for example, by low-pressure chemical vapor deposition (LPCVD) or plasma enhanced chemical vapor deposition (PECVD). The mask layer 202b is used as a hard mask during subsequent photolithography processes. In certain embodiments, a patterned photoresist layer 204 having a predetermined pattern is formed on the mask layer 202b.

Figure 2:
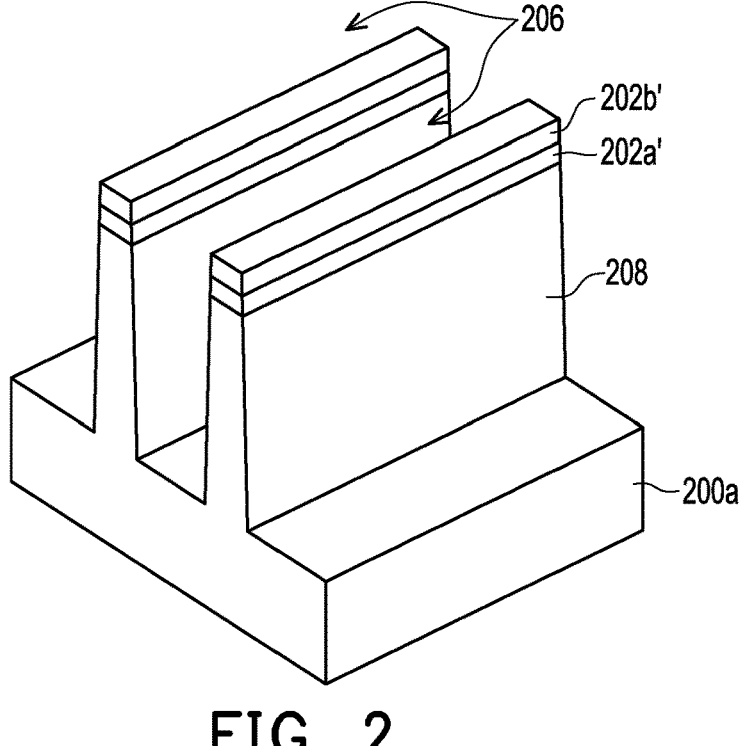

Referring to FIG. 2, in a subsequent step, the substrate 200 is patterned to form trenches 206 in the substrate 200 and fins 208 are formed between the trenches 206. For example, the mask layer 202b and the pad layer 202a which are not covered by the patterned photoresist layer 204 are sequentially etched to form a patterned mask layer 202b' and a patterned pad layer 202a' so as to expose the underlying semiconductor substrate 200. By using the patterned mask layer 202b', the patterned pad layer 202a' and the patterned photoresist layer 204 as a mask, portions of the semiconductor substrate 200 are exposed and etched to form the trenches 206 and the semiconductor fins 208. In some embodiments, the semiconductor fins 208 are covered by the patterned mask layer 202b', the patterned pad layer 202a' and the patterned photoresist layer 204. Two adjacent trenches 206 are spaced apart by a spacing. For example, in one embodiment, the spacing between trenches 206 may be smaller than about 30 nm. In other words, two adjacent trenches 206 are spaced apart by a corresponding semiconductor fin 208. The number of the fins 208 shown in FIG. 2 is merely for illustration, in some alternative embodiments, two or more parallel semiconductor fins may be formed in accordance with actual design requirements.

In some embodiments, a height of the semiconductor fins 208 and the depth of the trench 206 range from about 5 nm to about 500 nm. After the trenches 206 and the semiconductor fins 208 are formed, the patterned photoresist layer 204 is then removed. In one embodiment, a cleaning process may be performed to remove a native oxide of the semiconductor substrate 200a and the semiconductor fins 208. The cleaning process may be performed using diluted hydrofluoric (DHF) acid or other suitable cleaning solutions.

Figure 3:
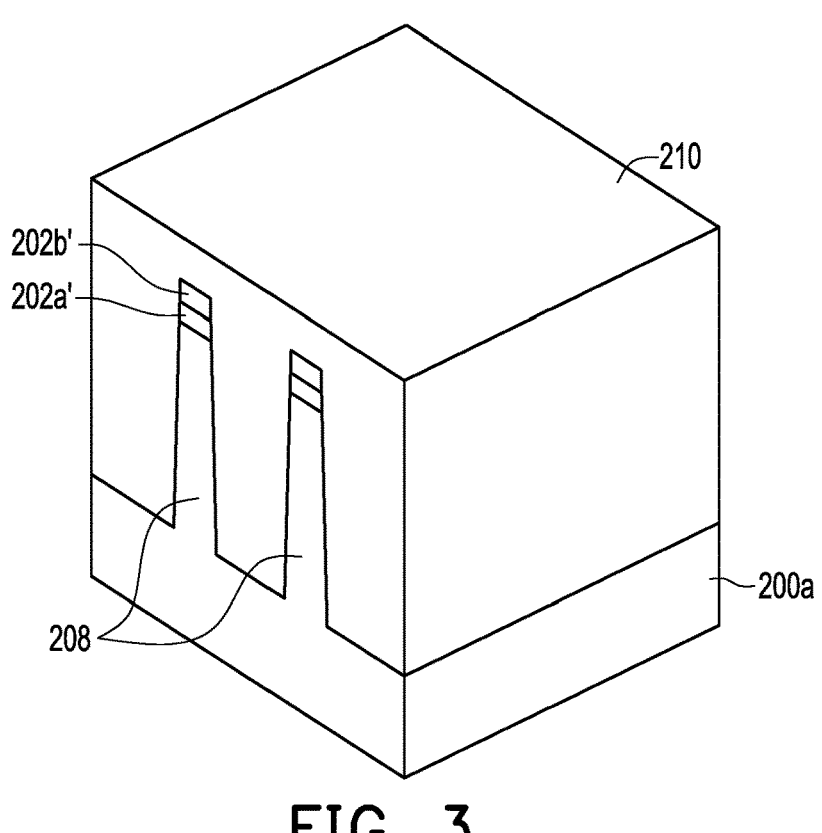
Figure 4:
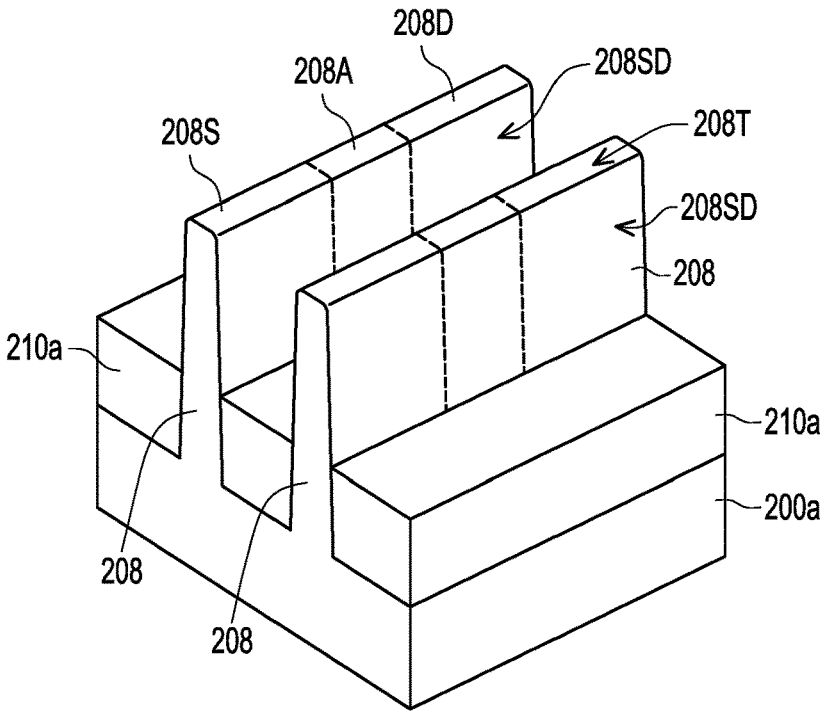

Referring to FIG. 3 and FIG. 4, in some embodiments, a plurality of insulators 210a are formed in the trenches 206 of the semiconductor substrate 200a. As illustrated in FIG. 3, in some embodiments, an insulating material 210 is first formed over the semiconductor substrate 200a to cover the semiconductor fins 208 and to fill up the trenches 206. Besides covering the semiconductor fins 208, the insulating material 210 is also covering the patterned pad layer 202a' and the patterned mask layer 202b'. In some embodiments, the insulating material 210 may include silicon oxide, silicon nitride, silicon oxynitride, a spin-on dielectric material, or a low-K dielectric material. It should be noted that the low-K dielectric materials are generally dielectric materials having a dielectric constant lower than 3.9. The insulating material 210 may be formed by high-density-plasma chemical vapor deposition (HDP-CVD), sub-atmospheric chemical vapor deposition (SACVD) or by spin-on processes.

Referring to FIG. 4, after forming the insulating material 210, etching processes are performed to remove a portion of the insulating material 210, the patterned mask layer 202b' and the patterned pad layer 202a' until the semiconductor fins 208 are exposed. In some embodiments, the insulating material 210 filled in the trenches 206 is partially removed by the etching process such that the insulators 210a are formed on the semiconductor substrate 200a. For example, each insulator 210a is located between two adjacent semiconductor fins 208. In one embodiment, the etching process may be a wet etching process with hydrofluoric acid (HF) or a dry etching process. In some embodiments, the top surfaces of the insulators 210a are lower than the top surfaces 208T of the semiconductor fins 208. The semiconductor fins 208 protrude from the top surfaces of the insulators 210a. Furthermore, the side surfaces 208SD of the semiconductor fins 208 are exposed from the insulators 210a. The height difference between the top surfaces 208T of the semiconductor fins 208 and the top surfaces of the insulators 210a ranges from about 15 nm to about 50 nm. In some embodiments, the protruded portions of the semiconductor fins 208 include a gate region 208A, and a source region 208S and a drain region 208D located aside the gate region 208A. In certain embodiments, the source region 208S and the drain region 208D of the semiconductor fins 208 are of substantially the same height as that of the gate region 208A of the semiconductor fins 208.

Figure 5A:
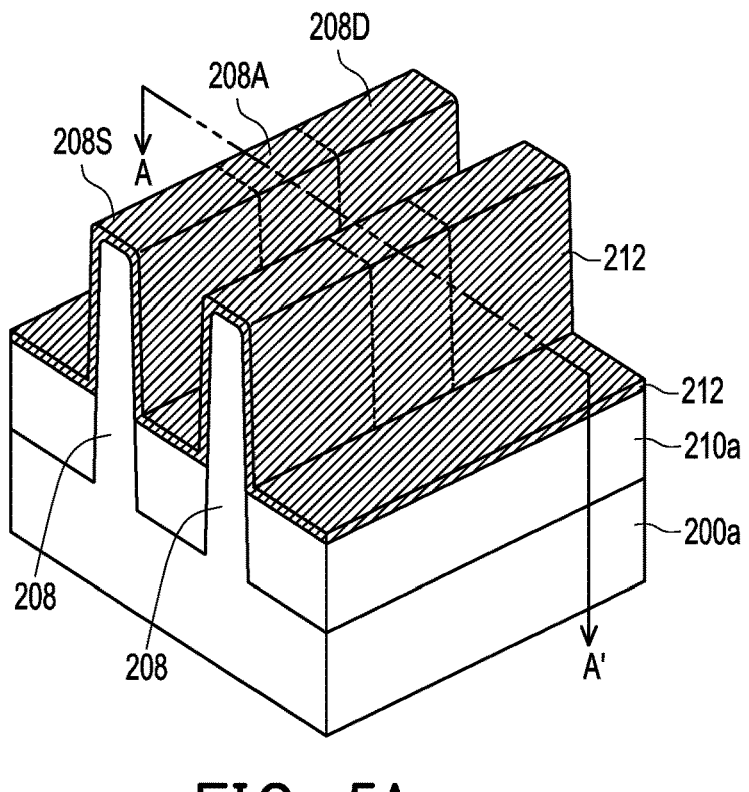
Figure 5B:
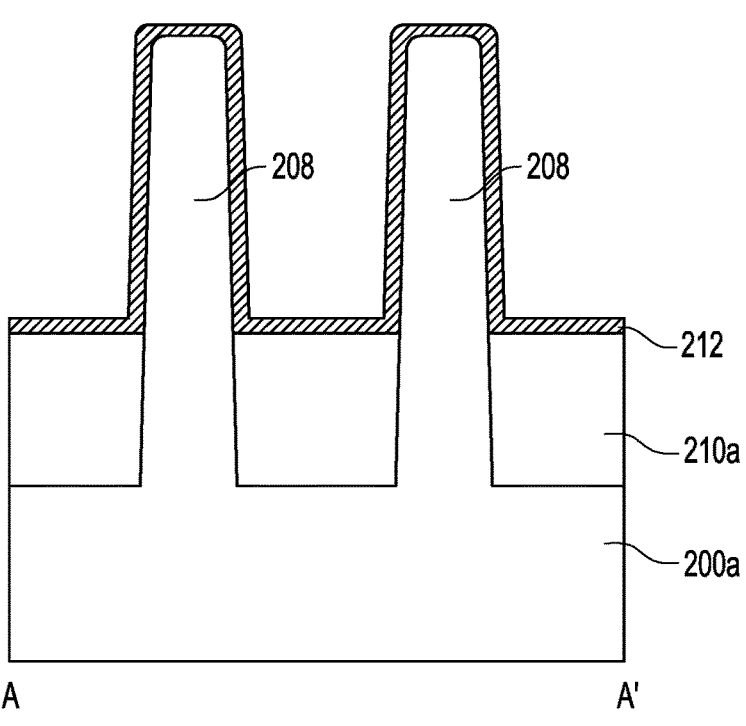

FIG. 5A is a perspective view of the semiconductor device at one of various stages of the manufacturing method. FIG. 5B is a sectional view illustrating the semiconductor device of FIG. 5A taken along the line A-A'. As illustrated in FIG. 5A and FIG. 5B, after forming the insulators 210a, a metal layer 212 is formed on the plurality of insulators 210a and across the semiconductor fins 208. The metal layer 212 is conformally formed over the insulators 210a and the semiconductor fins 208. For example, the metal layer 212 covers the source region 208S, the drain region 208D, the gate region 208A of the semiconductor fins 208, and covers the top surfaces 208T and side surfaces 208SD of the semiconductor fins 208. In some embodiments, the metal layer 212 is formed by deposition techniques, such as chemical vapor deposition (CVD), physical vapor deposition (PVD), atomic layer deposition (ALD) or the like. In certain embodiments, the metal layer 212 include a metal material such as titanium nitride (TiN), titanium (Ti), tungsten (W), tungsten nitride (WN), molybdenum (Mo), tantalum nitride (TaN), copper (Cu), copper aluminum (CuAl), or the like. In one embodiment, the metal layer 212 is titanium nitride (TiN).

Figure 6A:
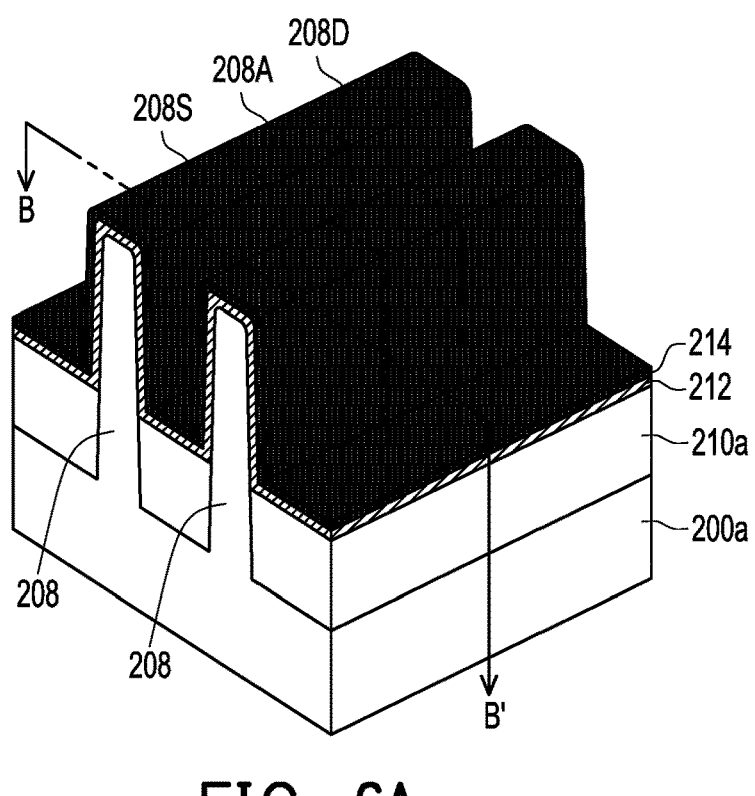
Figure 6B:
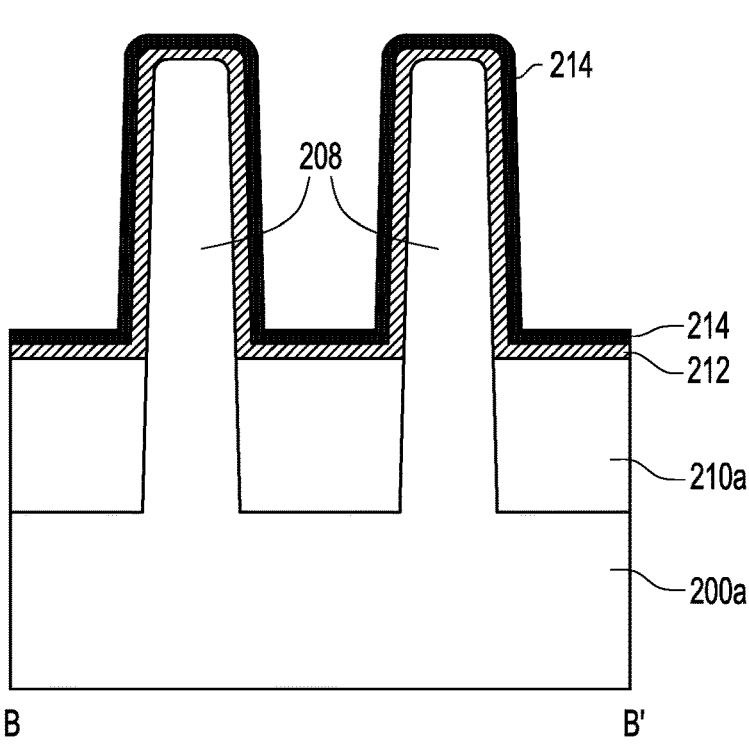

FIG. 6A is a perspective view of the semiconductor device at one of various stages of the manufacturing method. FIG. 6B is a sectional view illustrating the semiconductor device of FIG. 6A taken along the line B-B'. Referring to FIG. 6A and FIG. 6B, in a subsequent step, an insulating layer 214 is formed on the metal layer 212 over the plurality of insulators 210a, and across the semiconductor fins 208. The insulating layer 214 is conformally formed on the metal layer 212, and is formed over the insulators 210a and the semiconductor fins 208. In some embodiments, the metal layer 212 is sandwiched in between the insulating layer 214 and the semiconductor fins 208. In some embodiments, the material of the insulating layer 214 may include a metal oxide material or a high-k dielectric material. In some embodiments, the high-k dielectric materials are such as a hafnium (Hf) based dielectric materials or the like. In some embodiments, the insulating layer 214 include materials such as hafnium oxide, hafnium zirconium oxide, silicon-doped hafnium oxide, or the like. In some other embodiments, the insulating layer 214 include materials such as silicon oxide, silicon nitride, silicon carbonitride, or the like. In some embodiments, the method of forming the insulating layer 214 includes performing a suitable deposition technique, such as CVD, plasma-enhanced CVD, metal oxide chemical vapor deposition (MOCVD), ALD, or the like.

Figure 7:
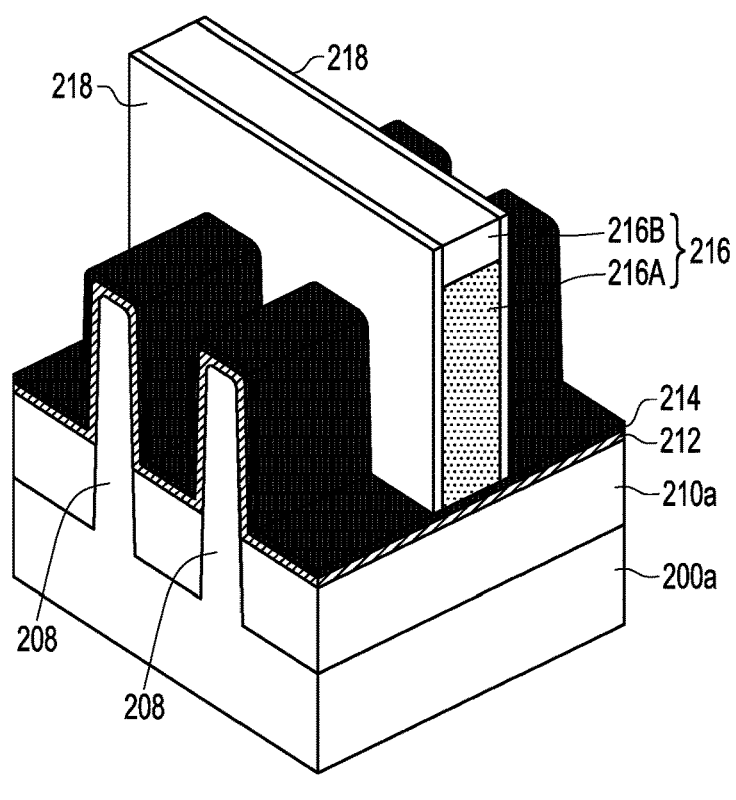

Referring to FIG. 7, in a subsequent step, a dummy gate stack 216 is formed on the insulating layer 214 and across the gate region 208A of the semiconductor fins 208. The dummy gate stack 216 may include a polysilicon strip 216A and a hard mask strip 216B. In some embodiments, the dummy gate stack 216 is formed by forming a dummy layer (including a polysilicon layer and a hard mask layer) over the insulating layer 214 and across the semiconductor fins 208, and patterning the dummy layer to form the polysilicon strip 216A and the hard mask strip 216B. In the exemplary embodiment, although one dummy gate stack 216 is illustrated herein, it should be noted that the number of dummy gate stack 216 is not limited to one and may be more than one. In some embodiments, the extension direction of the dummy gate stack 216 (the polysilicon strip 216A and the hard mask strip 216B) is arranged to be perpendicular to the extension direction of the semiconductor fins 208, and the dummy gate stack 216 is arranged across the semiconductor fins 208 and covers the gate region 208A of the semiconductor fins 208. In one embodiment, the material of the hard mask strip 216B includes silicon nitride, silicon oxide or the combination thereof.

Referring still to FIG. 7, after forming the dummy gate stack 216, spacer structures 218 are formed on two opposite sides of the dummy gate stack 216. In some embodiments, the spacer structures 218 are located on the insulating layer 214 and are covering sidewalls of the polysilicon strip 216A and the hard mask strip 216B. In some embodiments, the spacer structures 218 may be formed by conformally forming a spacer material layer over the insulating layer 214 and over the dummy gate stack 216, then performing an etching process on the spacer material layer to form the spacer structures 218. In some embodiments, the spacer material layer is formed of one or more dielectric materials, such as silicon nitride, silicon carbon oxynitride (SiCON), silicon carbonitride (SiCN) or combinations thereof. The spacer material layer may be a single layer or a multilayered structure. In some embodiments, the spacer material layer is formed by depositing a blanket layer of one or more dielectric materials. In one embodiment, the spacer material layer has a thickness ranging from 3 nm to 10 nm.

Figure 8:
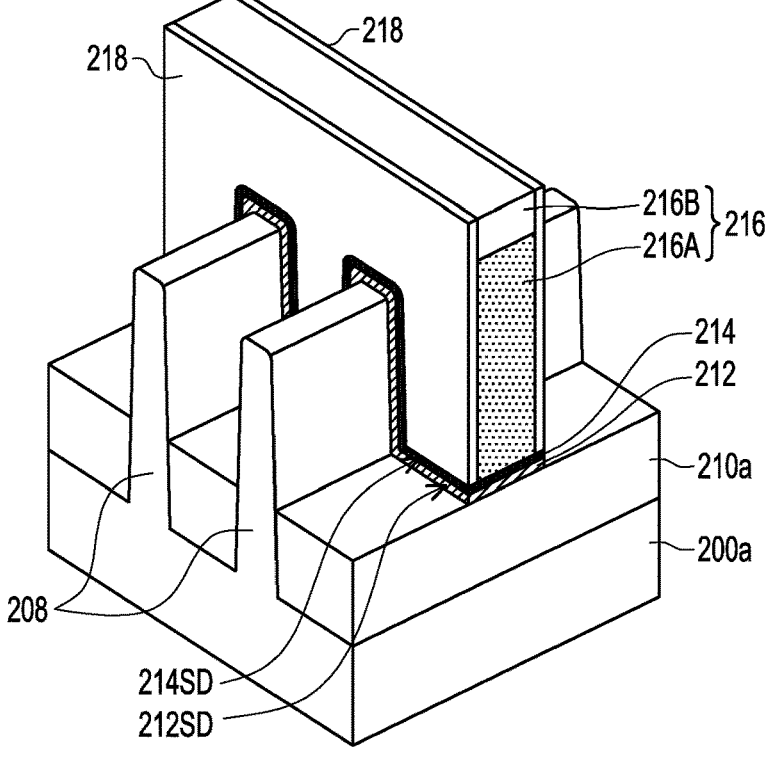

Referring to FIG. 8, after forming the dummy gate stack 216 and the spacer structures 218, the insulating layer 214 and the metal layer 212 are patterned so that side surfaces 214SD of the insulating layer 214 and side surfaces 212SD of the metal layer 212 are aligned with side surfaces of the spacer structure 218. In some embodiments, portions of the insulating layer 214 and the metal layer 212 not covered by the dummy gate stack 216 and the spacer structures 218 are removed. In certain embodiments, the insulating layer 214 and the metal layer 212 may be patterned or removed by, for example, anisotropic etching, isotropic etching, and/or through atomic layer etching (ALE) processes. After removing portions of the insulating layer 214 and the metal layer 212, the source region 208S and the drain region 208D (shown in FIG. 4) of the semiconductor fins 208 are exposed or revealed.

Figure 9:
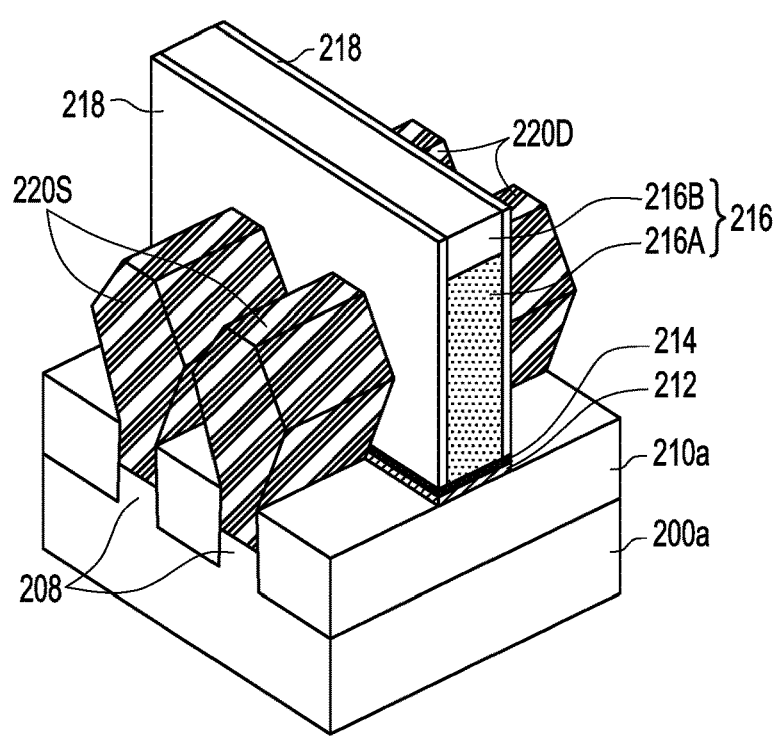

Referring to FIG. 9, in a subsequent step, the semiconductor fins 208 exposed by the dummy gate stack 216 and the spacer structures 218 are removed/recessed to form a plurality of recessed portions. For example, portions of the semiconductor fins 208 may be removed by, anisotropic etching, isotropic etching, or a combination thereof. In some embodiments, portions of the semiconductor fins 208 are recessed below the top surfaces of the insulators 210a. In some embodiments, the semiconductor fins 208 exposed by the dummy gate stack 216 and the spacer structures 218 are not entirely removed, and the remaining semiconductor fins 208 located in the recessed portion form the source/drain regions of the semiconductor fins 208. In some embodiments, strained material portions may be formed over the recessed portions of the semiconductor fins 208 to form a source material portion 220S and a drain material portion 220D. In some embodiments, the strained material portions (source material portion 220S and drain material portion 220D) are formed over portions of the semiconductor fins 208 that are revealed by the dummy gate stack 216. In some embodiments, the strained material portions (220S, 220D) cover and contacts the semiconductor fins 208. In some embodiments, the strained material portions (220S, 220D) are located on two opposite sides of the dummy gate stack 216.

In the exemplary embodiment, the strained material portions (220S, 220D) are grown on the source region 208S and drain region 208D of the semiconductor fins 208 to strain or stress the semiconductor fins 208. Thus, the strained material portions (220S, 220D) comprise a source material portion 220S disposed at a side of the dummy stack gate 216 and a drain material portion 220D disposed at the other side of the dummy gate stack 216. The source material portion 220S covers an end of the semiconductor fins 208 and the drain material portion 220D covers the other end of the semiconductor fins 208. In some embodiments, the strained material portions (220S, 220D) may be doped with a conductive dopant. In one embodiment, the strained material portions (220S, 220D) include materials such as SiGe, and is epitaxial-grown with a p-type dopant for straining a p-type FinFET. That is, the strained material portions (220S, 220D) are doped with the p-type dopant to be the source and the drain of the p-type FinFET. The p-type dopant comprises boron or $BF_2$, and the strained material portions (220S, 220D) may be epitaxial-grown by low-pressure CVD (LPCVD) process with in-situ doping. In another embodiment, the strained material portions (220S, 220D) include materials such as SiC, SiP, a combination of SiC/SiP, or SiCP, and is epitaxial-grown with an n-type dopant for straining an n-type FinFET. That is, the strained material portions (220S, 220D) are doped with the n-type dopant to be the source and the drain of the n-type FinFET. The n-type dopant comprises arsenic and/or phosphorus, and the strained material portions (220S, 220D) may be epitaxial-grown by LPCVD process with in-situ doping. The strained material portions (220S, 220D) may be a single layer or a multi-layer.

Figure 10:
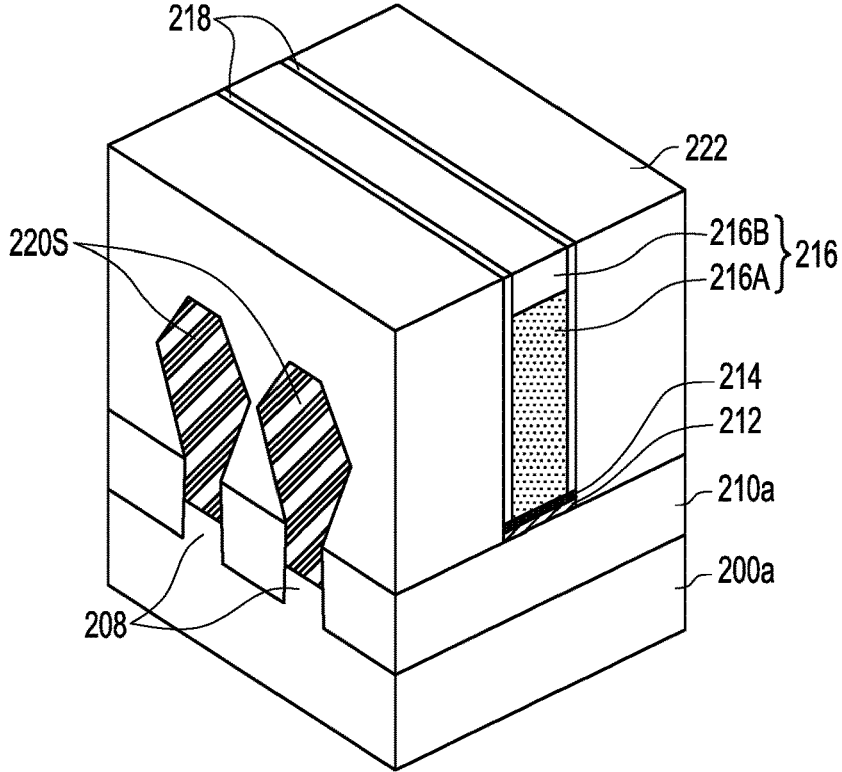

Referring to FIG. 10, after forming the strained material portions (220S, 220D), an interlayer dielectric layer 222 is formed on the insulators 210a to cover the strained material portions (220S, 220D). In some embodiments, the interlayer dielectric layer 222 is formed adjacent to the spacer structures 218. In some embodiments, the interlayer dielectric layer 222 includes silicon oxide, silicon nitride, silicon oxynitride, phosphosilicate glass (PSG), borophosphosilicate glass (BPSG), spin-on glass (SOG), fluorinated silica glass (FSG), carbon doped silicon oxide (e.g., SiCOH), polyimide, and/or a combination thereof. In some other embodiments, the interlayer dielectric layer 222 includes low-K dielectric materials. Examples of low-K dielectric materials include BLACK DIAMOND® (Applied Materials of Santa Clara, Calif.), Xerogel, Acrogel, amorphous fluorinated carbon, Parylene, BCB (bis-benzocyclobutenes), Flare, SILK® (Dow Chemical, Midland, Mich.), hydrogen silsesquioxane (HSQ) or fluorinated silicon oxide (SiOF), and/or a combination thereof. It is understood that the interlayer dielectric layer 222 may include one or more dielectric materials and/or one or more dielectric layers.

In some embodiments, the interlayer dielectric layer 222 is formed to a suitable thickness by flowable CVD (FCVD), CVD, high density plasma CVD (HDPCVD), sub-atmospheric CVD (SACVD), spin-on, sputtering, or other suitable methods. In some embodiments, an interlayer dielectric material layer (not illustrated) is formed to cover the insulators 210a and the dummy gate stack 216 first. Subsequently, the thickness of the interlayer dielectric material layer is reduced until a top surface of the dummy gate stack 216 is exposed, and so that the interlayer dielectric layer 222 is formed. The process of reducing the thickness of the interlayer dielectric material layer is achieved by a chemical mechanical polishing (CMP) process, an etching process, or other suitable process. The disclosure is not limited thereto.

Figure 11:
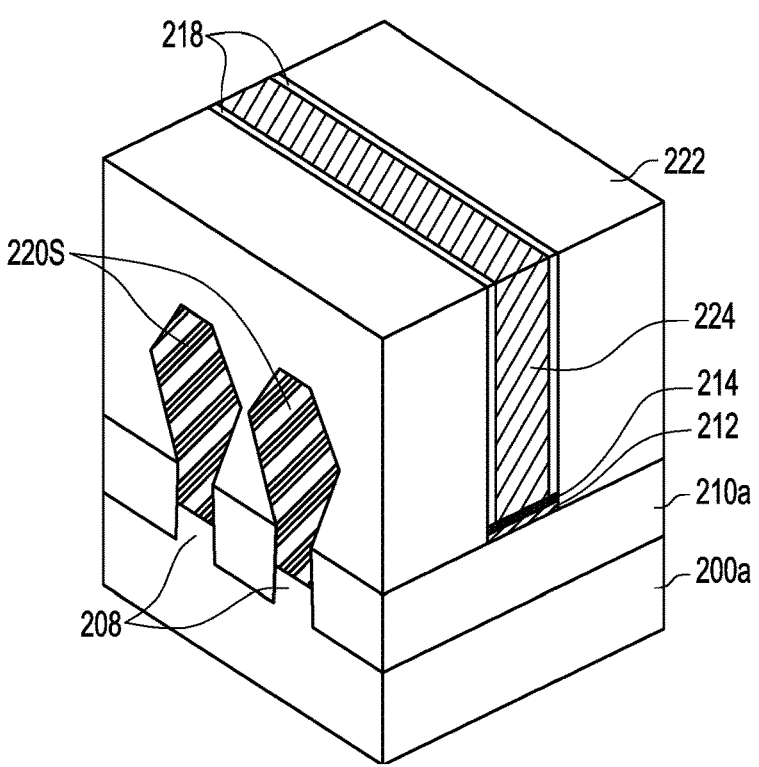

Referring to FIG. 11, a second metal layer 224 is formed by replacing the dummy gate stack 216 with the second metal layer 224. In some embodiments, the second metal layer 224 is a gate electrode. In some embodiments, the polysilicon strip 216A and the hard mask strip 216B located on the gate region 208A of the semiconductor fins 208 are removed to form the second metal layer 224. In one embodiment, the polysilicon strips 216A and the hard mask strips 216B are removed by anisotropic etching, whereas the spacer structures 218, the metal layer 212 and the insulating layer 214 are retained. After removing the dummy gate stack 216, the second metal layer 224 is formed over the gate region 208A of the semiconductor fins 208, and over the metal layer 212 and on the insulating layer 214.

In some embodiments, the second metal layer 224 includes a metal-containing material, such as aluminum (Al), copper (Cu), tungsten (W), cobalt (Co), titanium (Ti), tantalum (Ta), ruthenium (Ru), titanium nitride (TiN), titanium aluminide (TiAl), titanium aluminum nitride (TiAlN), tantalum nitride (TaN), tantalum carbide (TaC), nickel silicide (NiSi), cobalt monosilicide (CoSi), or a combination thereof. In some embodiments, a barrier, a work function layer, an interfacial layer, or a combination thereof, may be included in between the second metal layer 224 and the insulating layer 214. In some embodiments, the second metal layer 224 is formed on the insulating layer 214 by electroplating or deposition. In the exemplary embodiment, the metal layer 212, the insulating layer 214 and the second metal layer 224 together constitute a capacitor structure of the semiconductor device.

Figure 12A:
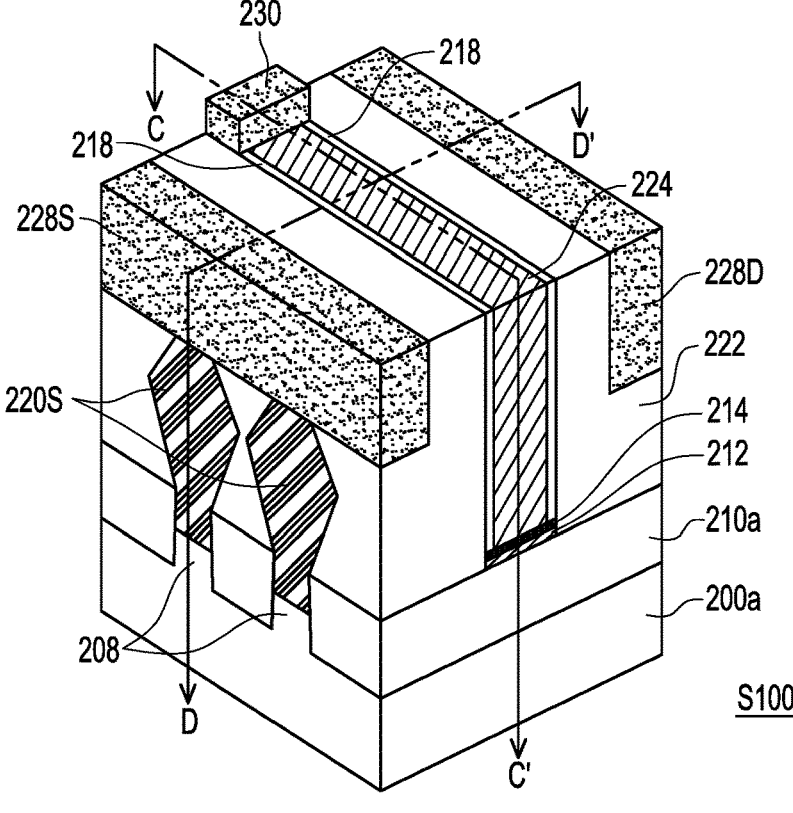
Figure 12B:
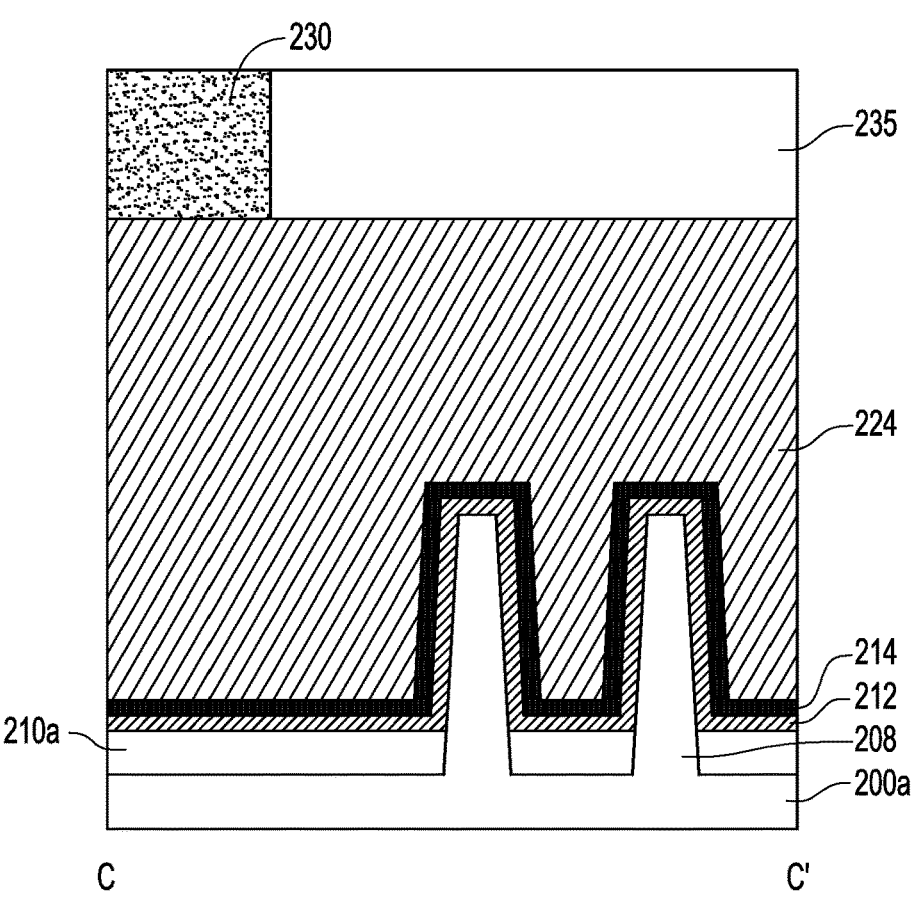
Figure 12C:
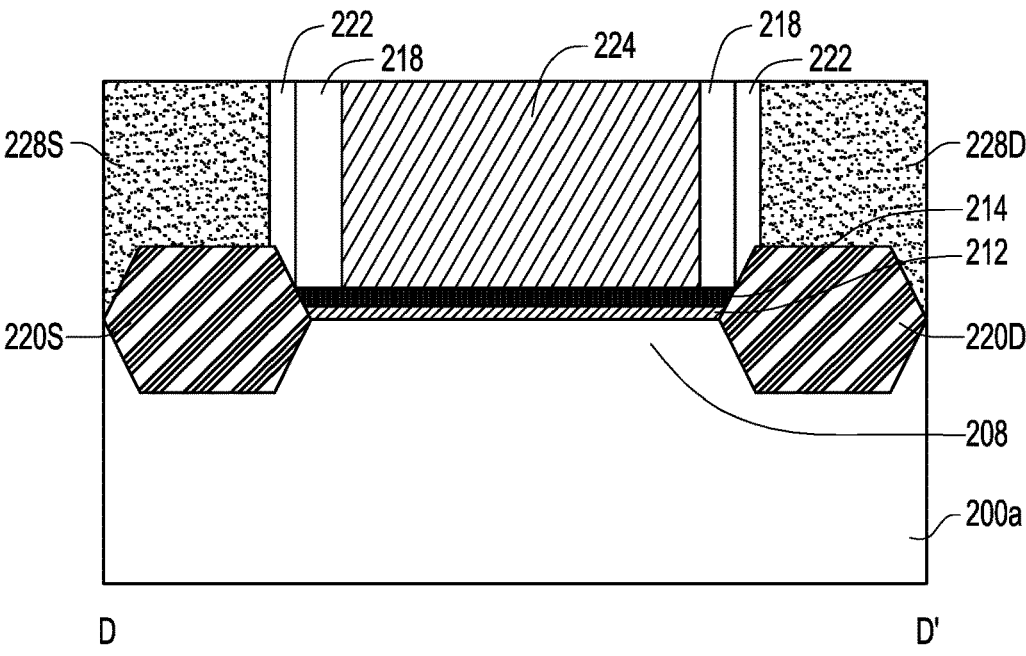

FIG. 12A is a perspective view of the semiconductor device at one of various stages of the manufacturing method. FIG. 12B is a sectional view illustrating the semiconductor device of FIG. 12A taken along the line C-C'. FIG. 12C is a sectional view illustrating the semiconductor device of FIG. 12A taken along the line D-D'. Referring to FIG. 12A to FIG. 12C, after forming the second metal layer 224, a source contact 228S, a drain contact 228D and a gate contact 230 are respectively formed. For example, the interlayer dielectric layer 222 may be patterned to form openings revealing the source material portion 220S and the drain material portion 220D. Thereafter, the source contact 228S may fill into the openings to be in physical contact with and electrically connected to the source material portion 220S, while the drain contact 228D may fill into the openings to be in physical contact with and electrically connected to the drain material portions 220D. In some embodiments, the gate contact 230 is formed over the second metal layer 224, and is in physical contact with and electrically connected to the second metal layer 224.

In the exemplary embodiment, the source contact 228S, the drain contact 228D and the gate contact 230 are formed of any conductive materials that can be used for electrically connecting the strained material portions (220S, 220D) and the second metal layer 224 with other elements in the semiconductor device. In some embodiments, an interlayer dielectric layer 235 is formed to surround the gate contact 230 (as shown in FIG. 12B). Furthermore, the interlayer dielectric layer 235 may surround the source contact 228S and the drain contact 228D. It is understood that the interlayer dielectric layer 235 may include one or more dielectric materials and/or one or more dielectric layers. In some embodiments, the metal layer 212 and the insulating layer 214 are in physical contact with the strained material portions (220S, 220D). In some other embodiments, the sidewalls of the metal layer 212 and the insulating layer 214 may also extend towards the source contact 228S and the drain contact 228D to physically contact the source contact 228S and the drain contact 228D. Up to here, a semiconductor device S100 in a capacitor region of the semiconductor device S100 according to some embodiments of the present disclosure is accomplished.

Figure 13:
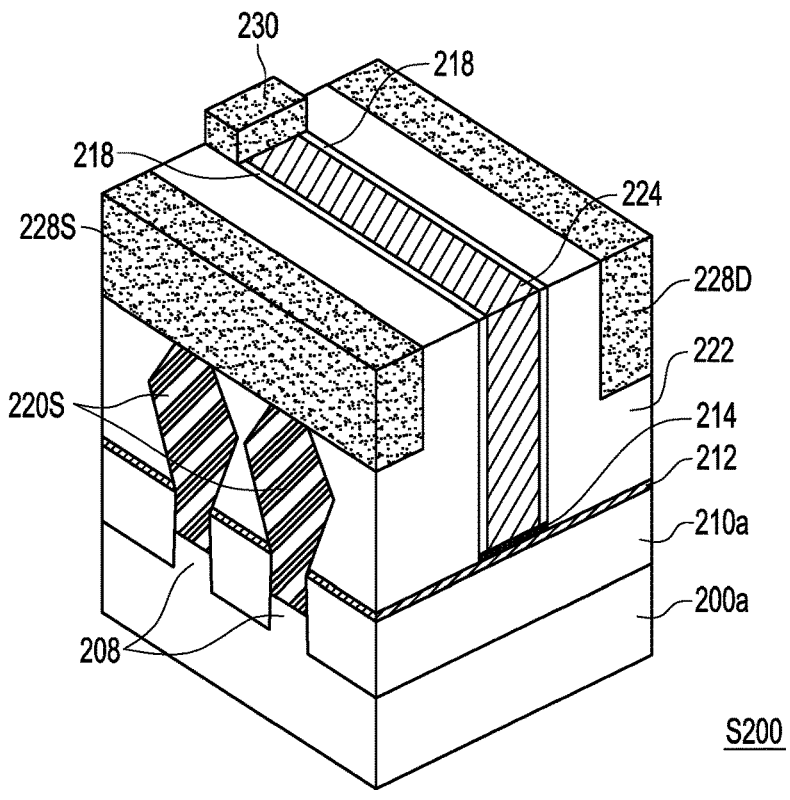
FIG. 13 is a schematic view of a semiconductor device in a capacitor region of the semiconductor device according to some other embodiments of the present disclosure.

FIG. 13 is a schematic view of a semiconductor device in a capacitor region of the semiconductor device according to some other embodiments of the present disclosure. The semiconductor device S200 illustrated in FIG. 13 is similar to the semiconductor device S100 illustrated in FIG. 12A to FIG. 12C, and may be fabricated using similar methods. Therefore, the same reference numerals are used to refer to the same or liked parts, and its detailed description will be omitted herein. The difference between the embodiments is that the metal layer 212 of the semiconductor device S200 illustrated in FIG. 13 is not patterned during the step shown in FIG. 8, and extends over the top surfaces of the insulators 210a. For example, as illustrated in FIG. 13, the metal layer 212 extends beyond the sidewalls of the spacer structures 218. Furthermore, the sidewalls of the metal layer 212 are misaligned with sidewalls of the spacer structures 218 and sidewalls of the insulating layer 214. In the embodiment shown in FIG. 13, since the metal layer 212, the insulating layer 214 and the second metal layer 224 are formed in the semiconductor device S200, a capacitor structure may be fabricated with improved linearity, uniformity, while having less leakage and high capacitance, and the process window of the semiconductor device S200 can be improved.

Figure 14:
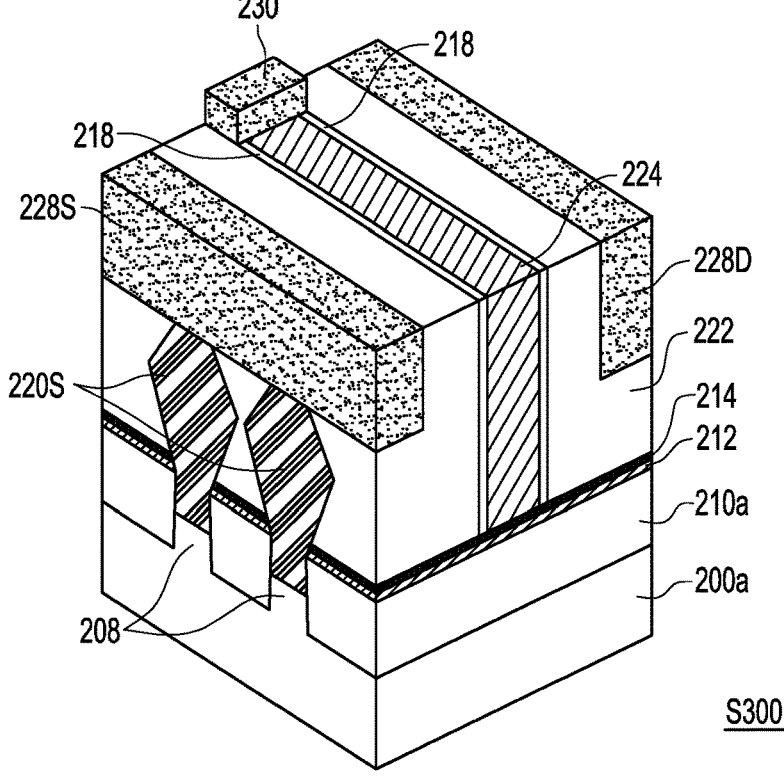
FIG. 14 is a schematic view of a semiconductor device in a capacitor region of the semiconductor device according to some other embodiments of the present disclosure.

FIG. 14 is a schematic view of a semiconductor device in a capacitor region of the semiconductor device according to some other embodiments of the present disclosure. The semiconductor device S300 illustrated in FIG. 14 is similar to the semiconductor device S100 illustrated in FIG. 12A to FIG. 12C, and may be fabricated using similar methods. Therefore, the same reference numerals are used to refer to the same or liked parts, and its detailed description will be omitted herein. The difference between the embodiments is that the metal layer 212 and the insulating layer 214 of the semiconductor device S300 illustrated in FIG. 14 are not patterned during the step shown in FIG. 8, and extends over the top surfaces of the insulators 210a. For example, as illustrated in FIG. 14, the metal layer 212 and the insulating layer 214 extends beyond the sidewalls of the spacer structures 218. Furthermore, the sidewalls of the metal layer 212 and sidewalls of the insulating layer 214 are misaligned with sidewalls of the spacer structures 218. In the embodiment shown in FIG. 14, since the metal layer 212, the insulating layer 214 and the second metal layer 224 are formed in the semiconductor device S300, a capacitor structure may be fabricated with improved linearity, uniformity, while having less leakage and high capacitance, and the process window of the semiconductor device S300 can be improved.

Figure 15A:
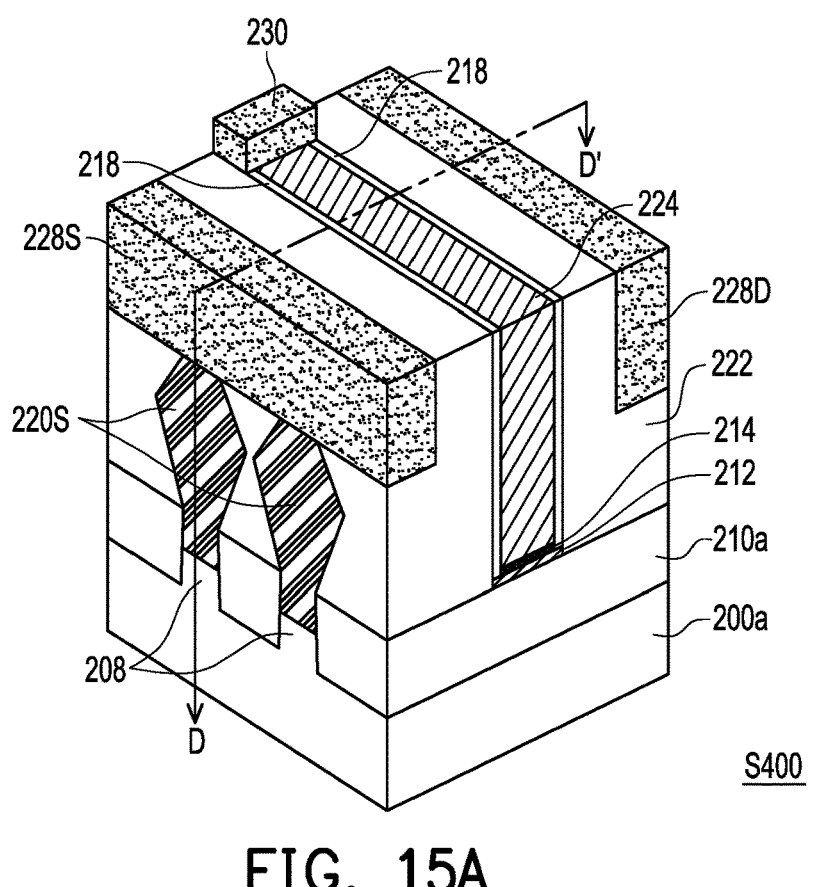
FIG. 15A and FIG. 15B are schematic views of a semiconductor device in a capacitor region of the semiconductor device according to some other embodiments of the present disclosure.
Figure 15B:
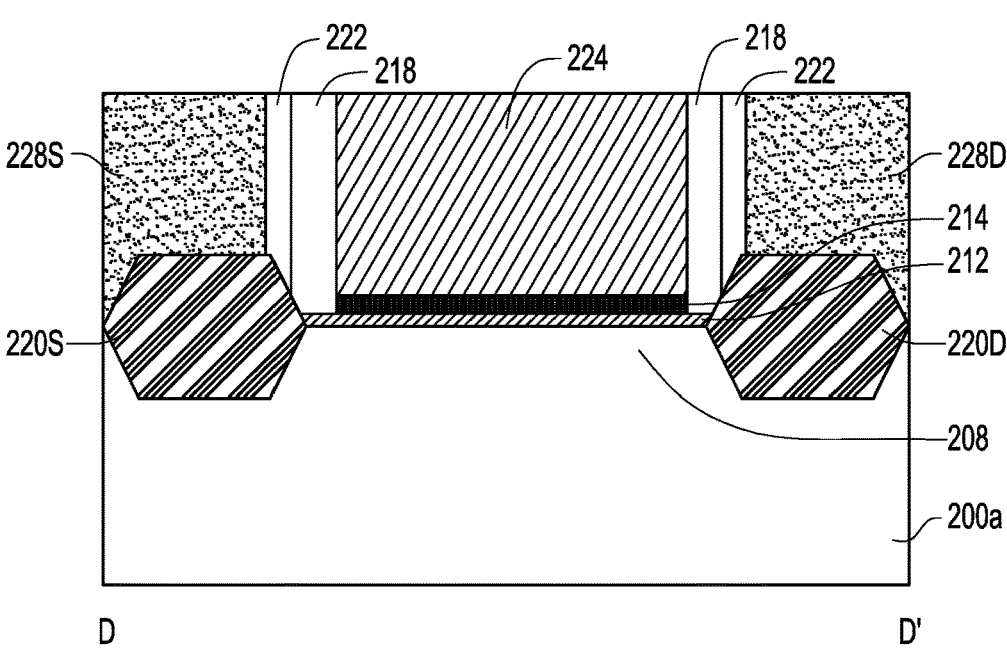

FIG. 15A is a perspective view of the semiconductor device in a capacitor region at one of various stages of the manufacturing method. FIG. 15B is a sectional view illustrating the semiconductor device of FIG. 15A taken along the line D-D'. The semiconductor device S400 illustrated in FIG. 15A and FIG. 15B is similar to the semiconductor device S100 illustrated in FIG. 12A to FIG. 12C, and may be fabricated using similar methods. Therefore, the same reference numerals are used to refer to the same or liked parts, and its detailed description will be omitted herein. The difference between the embodiments is that the insulating layer 214 shown in the semiconductor device S400 of FIG. 15A and FIG. 15B is not formed during the step shown in FIG. 6A. Instead, the insulating layer 214 of FIG. 15A and FIG. 15B may be formed during the replacement of the dummy gate stack 216. In other words, the insulating layer 214 may be formed to have sidewalls that are aligned with the sidewalls of the second metal layer 224. Furthermore, the sidewalls of the insulating layer 214 are covered up by the spacer structures 218. In the exemplary embodiment, the metal layer 212 is in physical contact with the strained material portions (220S, 220D), while the insulating layer 214 and the second metal layer 224 are physically separated from the strained material portions (220S, 220D) by the spacer structures 218. In the embodiment shown in FIG. 15A and FIG. 15B, since the metal layer 212, the insulating layer 214 and the second metal layer 224 are formed in the semiconductor device S400, a capacitor structure may be fabricated with improved linearity, uniformity, while having less leakage and high capacitance, and the process window of the semiconductor device S400 can be improved.

Figure 16A:
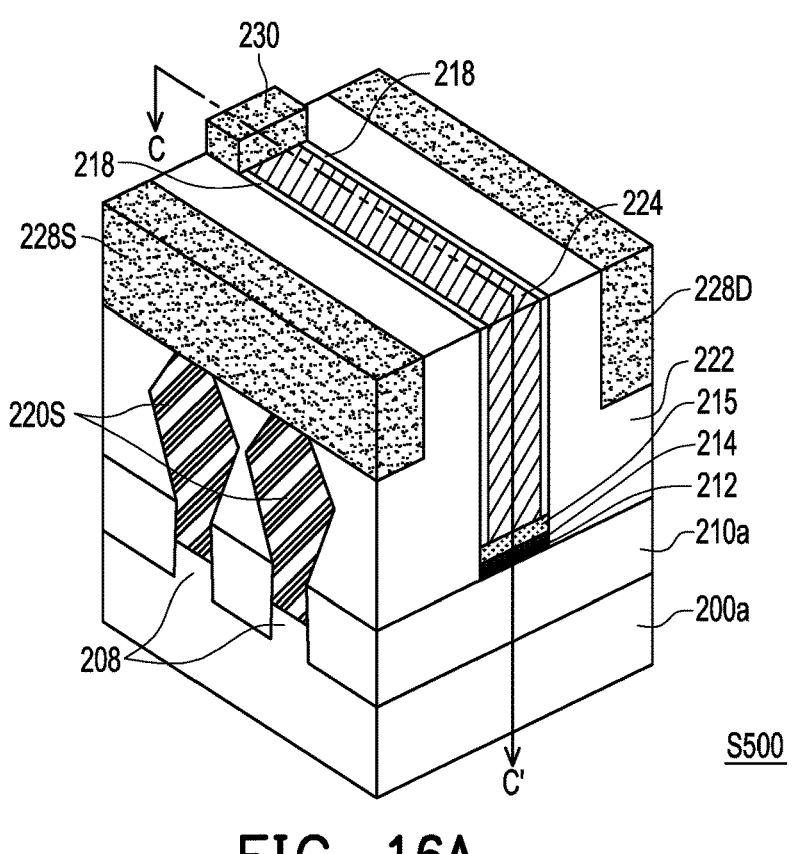
FIG. 16A to FIG. 16C are schematic views of a semiconductor device in a capacitor region of the semiconductor device according to some other embodiments of the present disclosure.
Figure 16B:
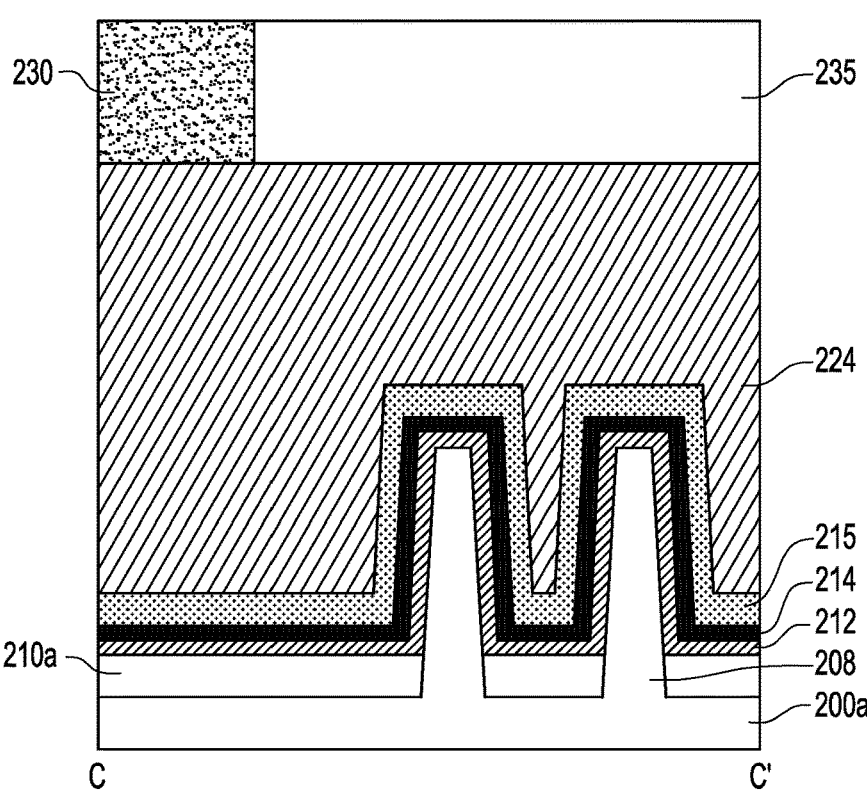
Figure 16C:
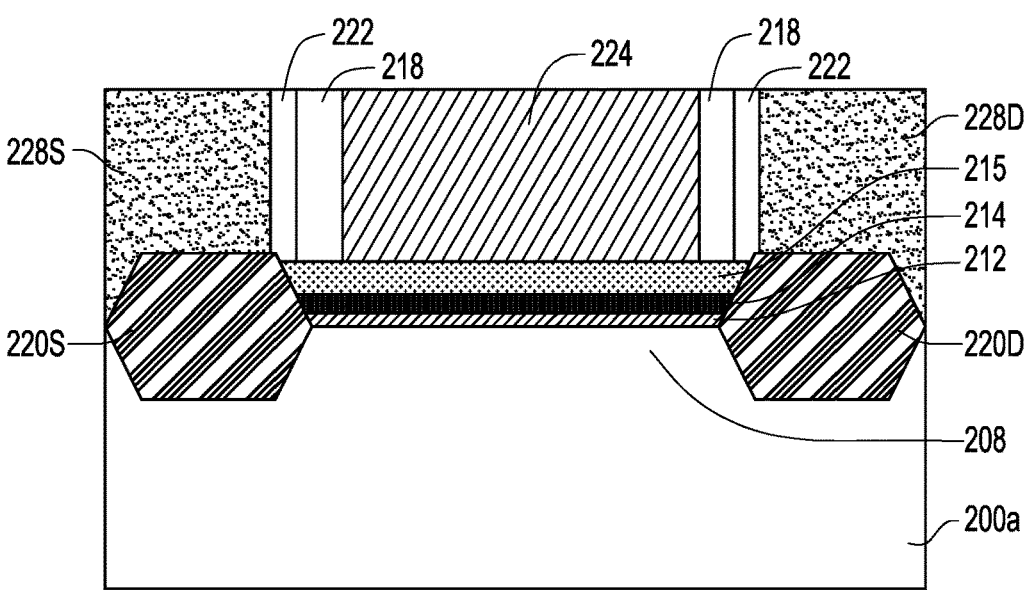

FIG. 16A is a perspective view of the semiconductor device in a capacitor region at one of various stages of the manufacturing method. FIG. 16B is a sectional view illustrating the semiconductor device of FIG. 16A taken along the line C-C'. FIG. 16C is a sectional view illustrating the semiconductor device of FIG. 16A taken along the line D-D'. The semiconductor device S500 illustrated in FIG. 16A and FIG. 16B is similar to the semiconductor device S100 illustrated in FIG. 12A to FIG. 12C, and may be fabricated using similar methods. Therefore, the same reference numerals are used to refer to the same or liked parts, and its detailed description will be omitted herein. The difference between the embodiments is that a second insulating layer 215 (or a gate dielectric layer) is further formed on the insulating layer 214.

For example, as illustrated in FIG. 16A to FIG. 16C, the second insulating layer 215 is conformally formed over the insulating layer 214 and over the semiconductor fins 208. In some embodiments, sidewalls of the metal layer 212, the insulating layer 214 and the second insulating layer 215 are in physical contact with the strained material portions (220S, 220D). In some embodiments, the second insulating layer 215 include a metal oxide material or a high-k dielectric material similar to that mentioned for the insulating layer 214. However, in the exemplary embodiment, the metal oxide material or a high-k dielectric material used in the second insulating layer 215 is different from the metal oxide material or a high-k dielectric material used in the insulating layer 214. In another embodiment, the insulating layer 214 and the second insulating layer 215 are made of the same materials. Furthermore, in the exemplary embodiment, a thickness of the second insulating layer 215 is different from a thickness of the insulating layer 214. For example, the thickness of the second insulating layer 215 is greater than the thickness of the insulating layer 214. However, the disclosure is not limited thereto, and in alternative embodiments, the thickness of the second insulating layer 215 is equal to the thickness of the insulating layer 214. In the embodiment shown in FIG. 16A to FIG. 16C, since the metal layer 212, the insulating layer 214, the second insulating layer 215 and the second metal layer 224 are formed in the semiconductor device S500, a capacitor structure may be fabricated with improved linearity, uniformity, while having less leakage and high capacitance, and the process window of the semiconductor device S500 can be improved.

Figure 17A:
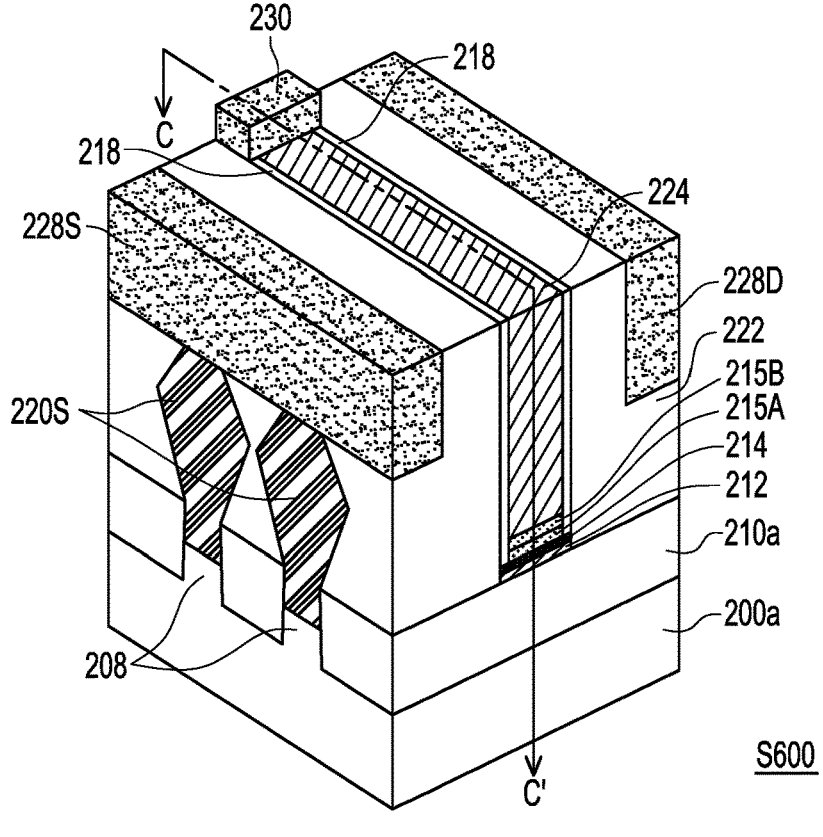
FIG. 17A to FIG. 17C are schematic views of a semiconductor device in a capacitor region of the semiconductor device according to some other embodiments of the present disclosure.
Figure 17B:
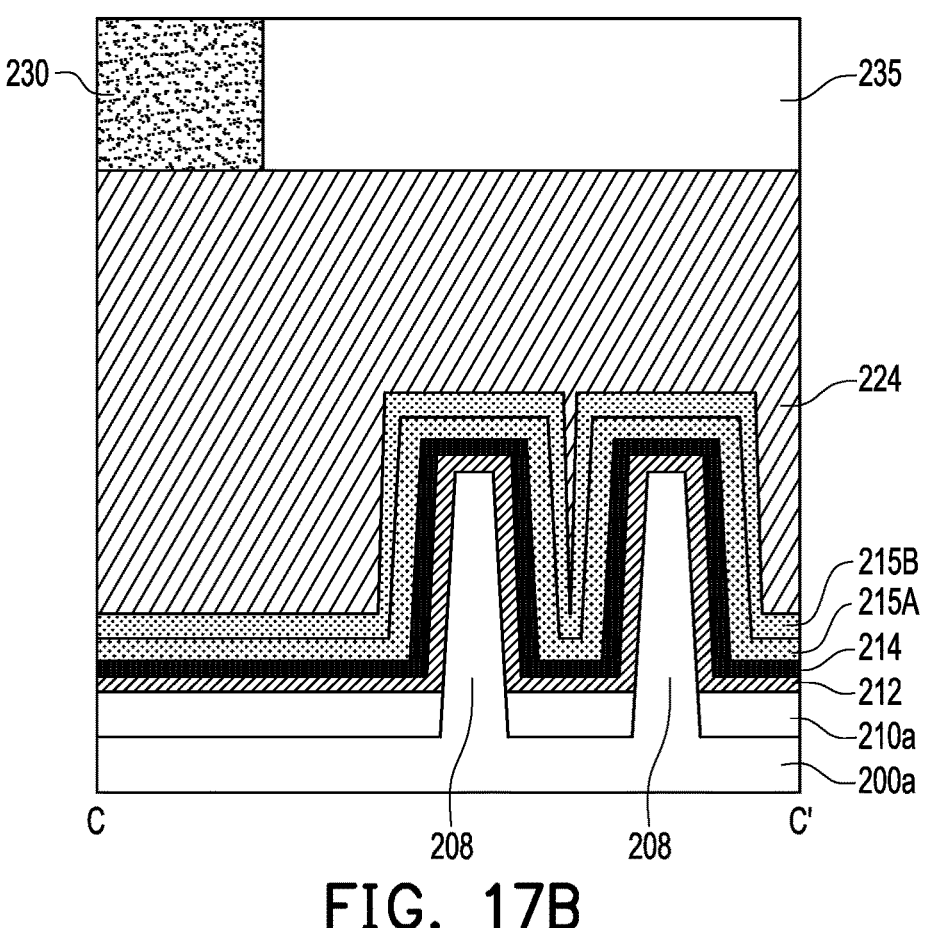
Figure 17C:
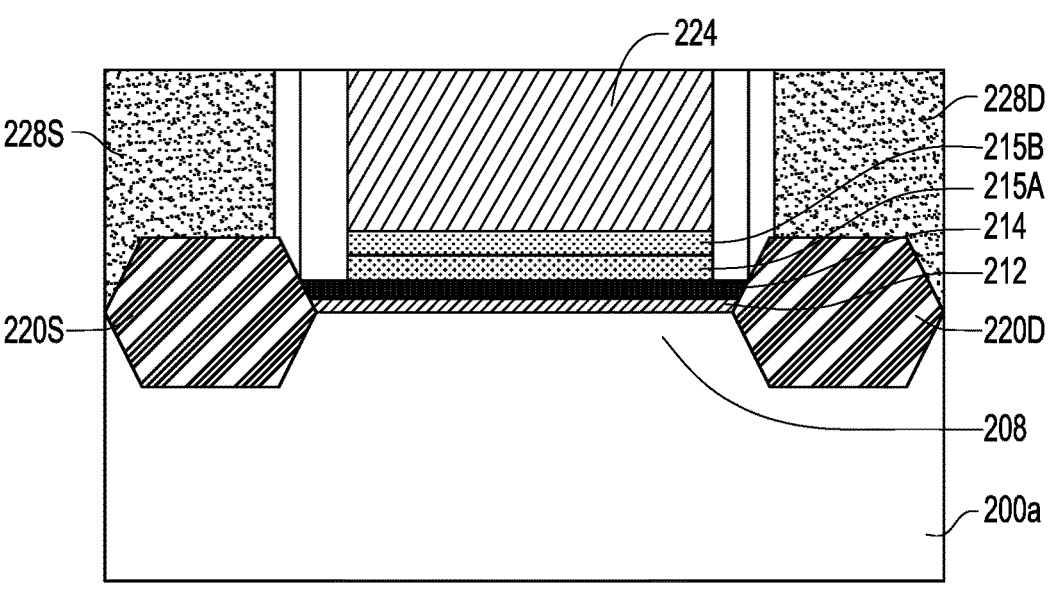

FIG. 17A is a perspective view of the semiconductor device in a capacitor region at one of various stages of the manufacturing method. FIG. 17B is a sectional view illustrating the semiconductor device of FIG. 17A taken along the line C-C'. FIG. 17C is a sectional view illustrating the semiconductor device of FIG. 17A taken along the line D-D'. The semiconductor device S600 illustrated in FIG. 17A and FIG. 17B is similar to the semiconductor device S100 illustrated in FIG. 12A to FIG. 12C, and may be fabricated using similar methods. Therefore, the same reference numerals are used to refer to the same or liked parts, and its detailed description will be omitted herein. The difference between the embodiments is that a second insulating layer 215A and a third insulating layer 215B (gate insulating layer) is further formed on the insulating layer 214.

As illustrated in FIG. 17A to FIG. 17C, the second insulating layer 215A and the third insulating layer 215B are conformally formed over the insulating layer 214 and over the semiconductor fins 208. In some embodiments, sidewalls of the second insulating layer 215A and the third insulating layer 215B are aligned with sidewalls of the second metal layer 224. In some embodiments, the second insulating layer 215A and the third insulating layer 215B include a metal oxide material or a high-k dielectric material similar to that mentioned for the insulating layer 214. Furthermore, the choice of material and a thickness of the insulating layer 214, the second insulating layer 215A and the third insulating layer 215B may be the same or different based on design requirements. Although in the illustrated embodiment, there is three insulating layers (214, 215A, 215B) located in between the metal layer 212 and the second metal layer 224, the disclosure is not limited thereto. In some alternative embodiments, the number of insulating layers located in between the metal layer 212 and the second metal layer 224 may be three or more, and may include four, five or six insulating layers. In the embodiment shown in FIG. 17A to FIG. 17C, since the metal layer 212, the insulating layer 214, the second insulating layer 215A, the third insulating layer 215B and the second metal layer 224 are formed in the semiconductor device S600, a capacitor structure may be fabricated with improved linearity, uniformity, while having less leakage and high capacitance, and the process window of the semiconductor device S600 can be improved.

Figure 18A:
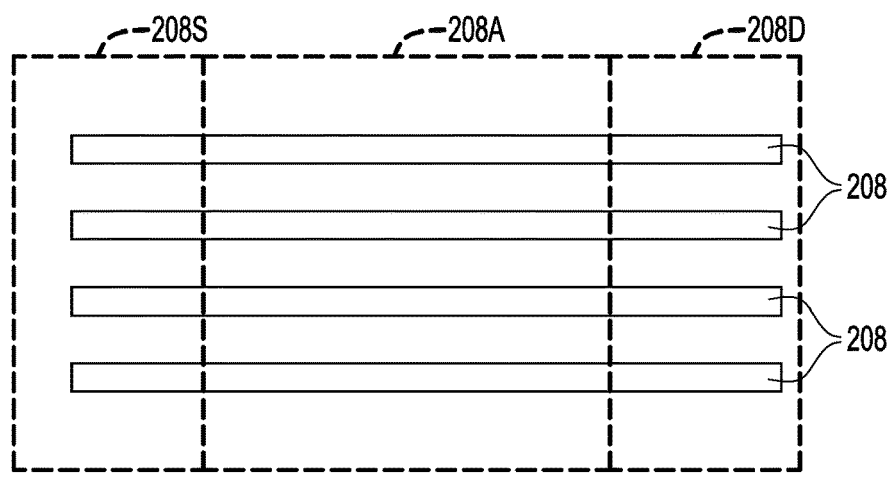
FIG. 18A to FIG. 19B are schematic views of various stages in a method of fabricating a semiconductor device in a capacitor region of the semiconductor device according to some exemplary embodiments of the present disclosure.

FIG. 18A to FIG. 19B are schematic views of various stages in a method of fabricating a semiconductor device in a capacitor region of the semiconductor device according to some exemplary embodiments of the present disclosure. FIG. 18A illustrates a top view of a semiconductor device corresponding to a step shown in FIG. 4 of the fabrication process. As shown in FIG. 18A, the semiconductor fins 208 are extending along a first direction, and are arranged in parallel with one another in a second direction perpendicular to the first direction. In some embodiments, the semiconductor fins 208 include a gate region 208A, and a source region 208S and a drain region 208D located aside the gate region 208A.

Figure 18B:
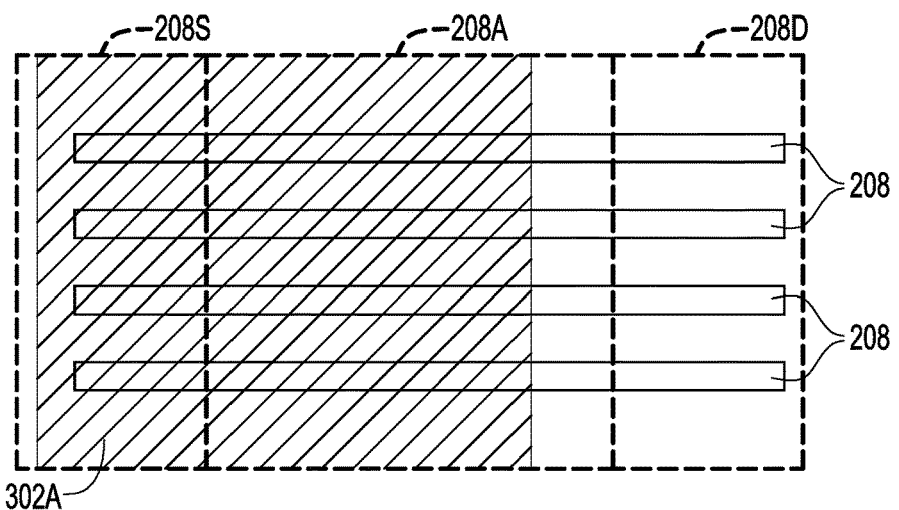

Referring to FIG. 18B, in some embodiments, a first metal layer 302A is formed over the source region 208S and formed in parts of the gate region 208A. Furthermore, the first metal layer 302A is excluded from the drain region 208D. In some embodiments, the first metal layer 302A may include the same materials mentioned for the metal layer 212, thus its detailed description will be omitted herein. In a subsequent step a first insulating layer 304A (illustrated in FIG. 19A and FIG. 19B) is formed over the first metal layer 302A to cover the first metal layer 302A. The first insulating layer 304A may include the same materials mentioned for the insulating layer 214, thus its detailed description will be omitted herein.

Figure 18C:
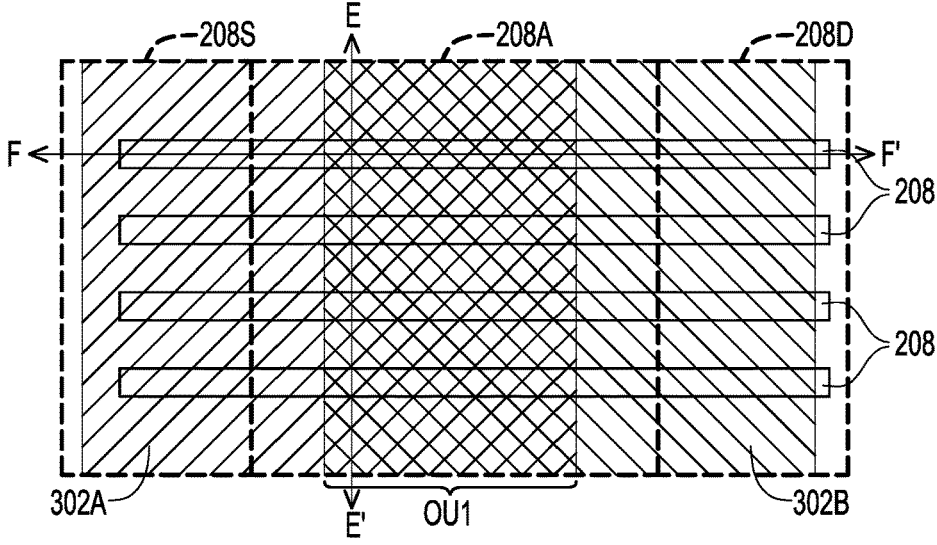

Referring to FIG. 18C, in a subsequent step, a second metal layer 302B is formed over the drain region 208D and formed in parts of the gate region 208A. Furthermore, the second metal layer 302B is excluded from the source region 208D. In some embodiments, the second metal layer 302B and the first metal layer 302A forms an overlapping region OUI in the gate region 208A. For example, in the overlapping region OUI, the first insulating layer 304A is sandwiched in between the first metal layer 302A and the second metal layer 302B. In some embodiments, the steps illustrated in FIG. 18B and FIG. 18C may be repeated to form metal layers and insulating layers that are alternately arranged as shown in FIG. 19A and FIG. 19B.

Figure 19A:
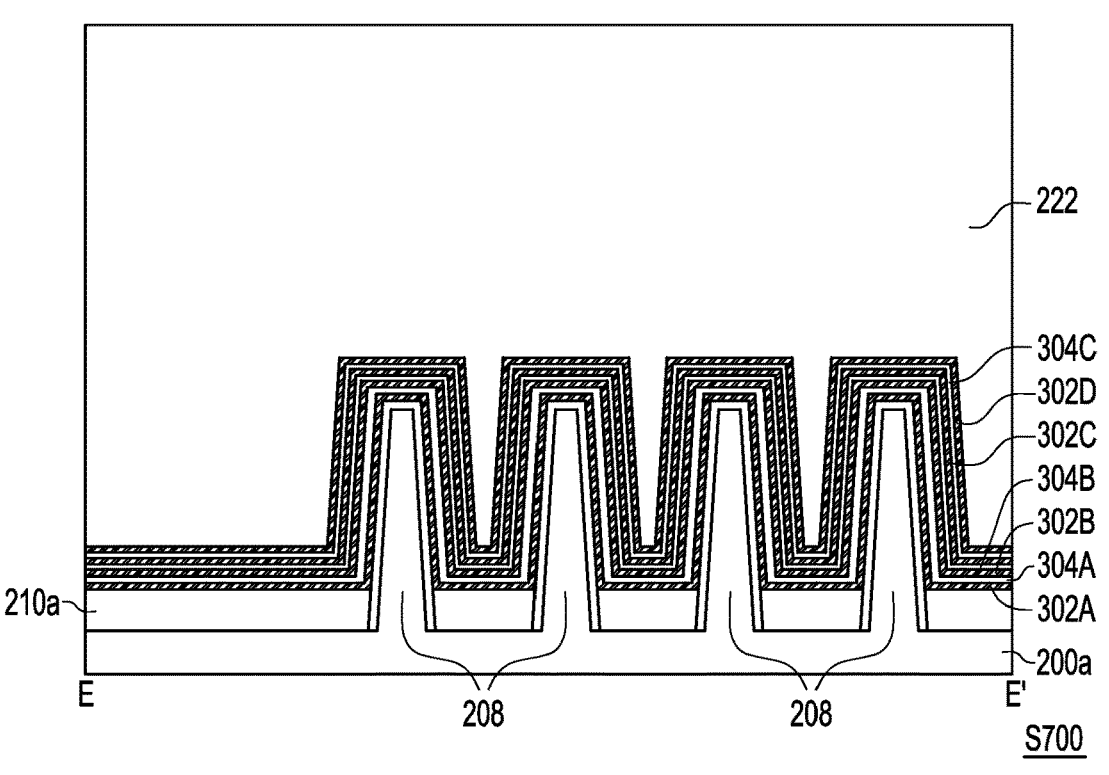
Figure 19B:
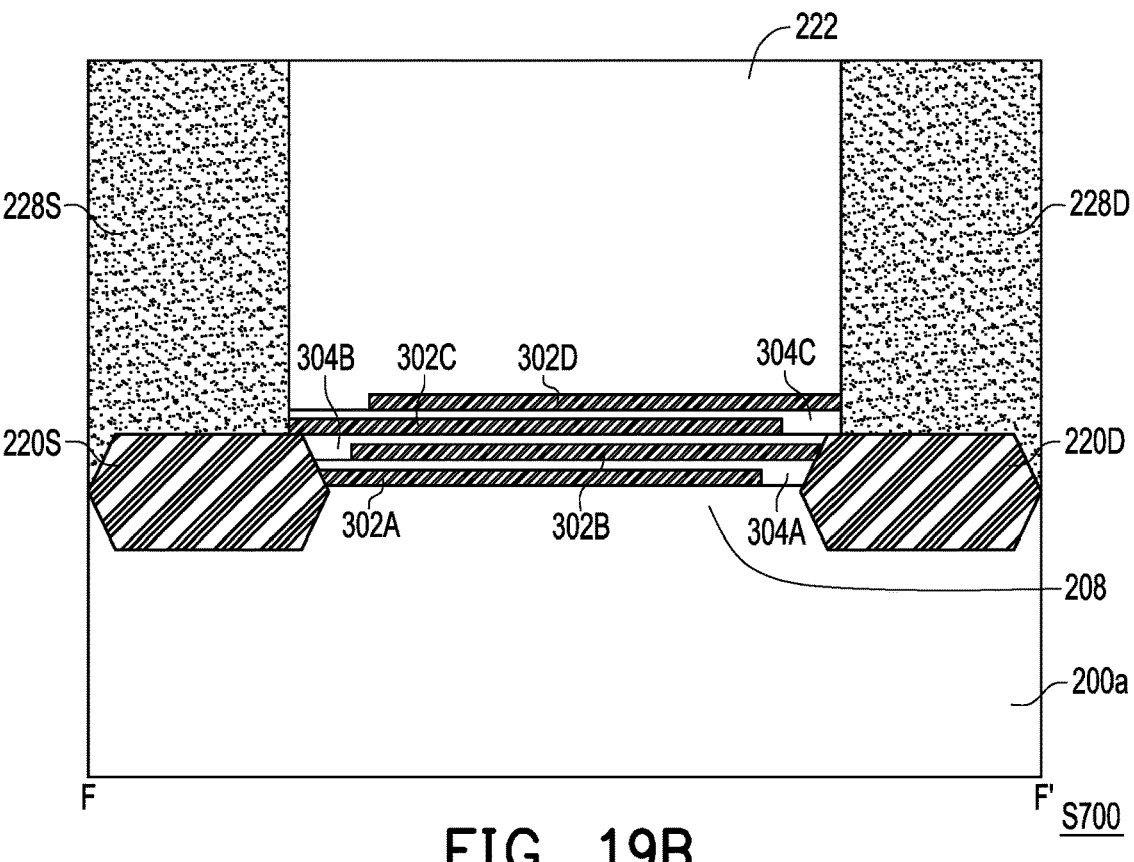

FIG. 19A is a sectional view illustrating the semiconductor device of FIG. 18C taken along the line E-E' after forming alternating metal and insulating layers. FIG. 19B is a sectional view illustrating the semiconductor device of FIG. 18C taken along the line F-E' after forming alternating metal and insulating layers. As illustrated in FIG. 19A and FIG. 19B, after forming the second metal layer 302B, a second insulating layer 304B, a third metal layer 302C, a third insulating layer 304C and a fourth metal layer 302D are sequentially formed over the second metal layer 302B to form alternating metal and insulating layers. For example, the second insulating layer 304B is disposed on the second metal layer 302B and over the fins 208. The third metal layer 302C is disposed on the second insulating layer 304B and over the fins 208. The third insulating layer 304C is disposed on the third metal layer 302C and over the fins 208. Furthermore, the fourth metal layer 302D is disposed on the third insulating layer 304C and over the fin 208, while the interlayer dielectric layer 222 is covering the third insulating layer 304C. After forming the interlayer dielectric layer 222 and the strained material portions (220S, 220D), and forming the source contact 228S and drain contact 228D in a way similar to the above embodiments, a semiconductor device S700 in accordance with some embodiments of the present disclosure is accomplished.

In the semiconductor device S700, the first metal layer 302A and third metal layer 302C are electrically connected to source region materials (source material portion 220S and source contact 228S) of the semiconductor device S700, and the second metal layer 302B and the fourth metal layer 302D are electrically connected to drain region materials (drain material portion 220D and drain contact 228D) of the semiconductor device S700. Furthermore, the semiconductor device S700 is absent of any gate electrode and gate contacts. In the embodiment shown in FIG. 19A to FIG. 19C, since the first metal layer 302A, the first insulating layer 304A, the second metal layer 302B, the second insulating layer 304B, the third metal layer 302C, the third insulating layer 304C and the fourth metal layer 302D are alternately arranged and formed in the semiconductor device S700, a multilayered capacitor structure may be fabricated with improved linearity, uniformity, while having less leakage and high capacitance, and the process window of the semiconductor device S700 can be improved.

Figures 20A, 20B:
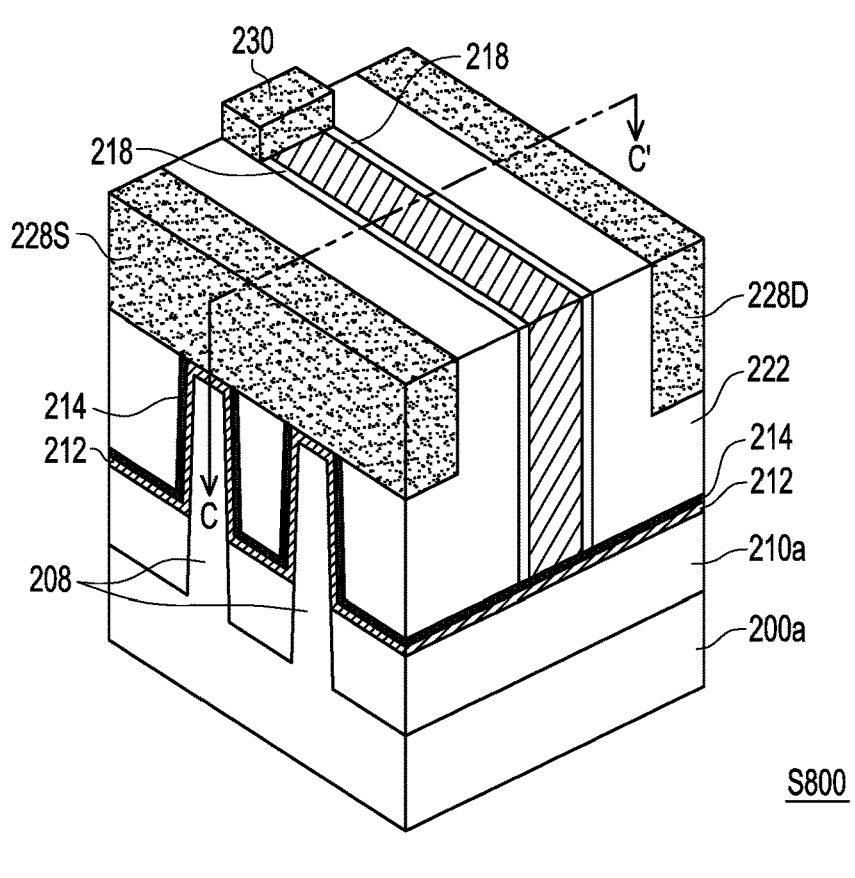
FIG. 20A and FIG. 20B are schematic views of a semiconductor device in a capacitor region of the semiconductor device according to some other embodiments of the present disclosure.

FIG. 20A is a perspective view of the semiconductor device in a capacitor region at one of various stages of the manufacturing method. FIG. 20B is a sectional view illustrating the semiconductor device of FIG. 20A taken along the line C-C'. The semiconductor device S800 illustrated in FIG. 20A and FIG. 20B is similar to the semiconductor device S300 illustrated in FIG. 14 and may be fabricated using similar methods. Therefore, the same reference numerals are used to refer to the same or liked parts, and its detailed description will be omitted herein. The difference between the embodiments is that the semiconductor fins 208 in the source region 208S and drain region 208D are not removed, and that the strained material portions (220S, 220D) are not formed.

As illustrated in FIG. 20A and FIG. 20B, in some embodiments, the metal layer 212 and the insulating layer 214 are in physical contact with the source contact 228S and the drain contact 228D. Furthermore, the source contact 228S and the drain contact 228D are directly disposed on top surfaces of the metal layer 212. In the embodiment shown in FIG. 20A and FIG. 20B, since the metal layer 212, the insulating layer 214, and the second metal layer 224 are formed in the semiconductor device S800, a capacitor structure may be fabricated with improved linearity, uniformity, while having less leakage and high capacitance, and the process window of the semiconductor device S800 can be improved.

Figure 21A:
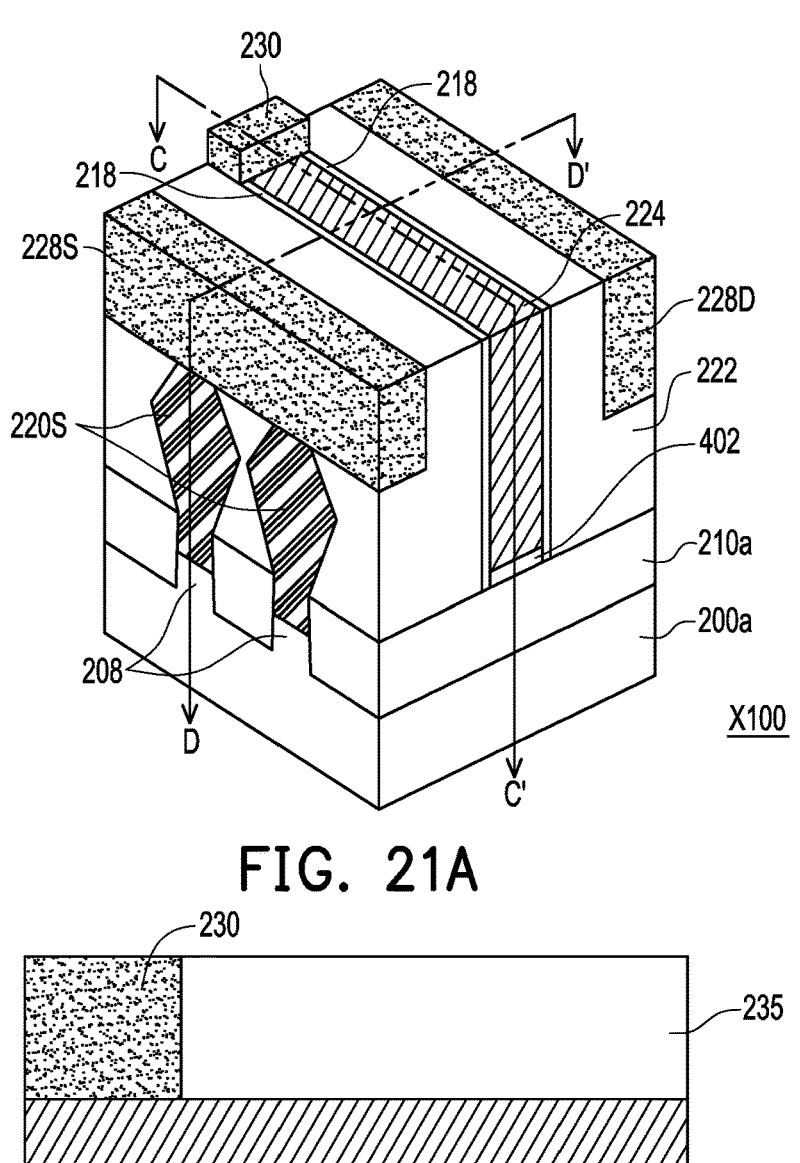
FIG. 21A to FIG. 21C are schematic views of a semiconductor device in a logic region of the semiconductor device according to some other embodiments of the present disclosure.
Figure 21B:
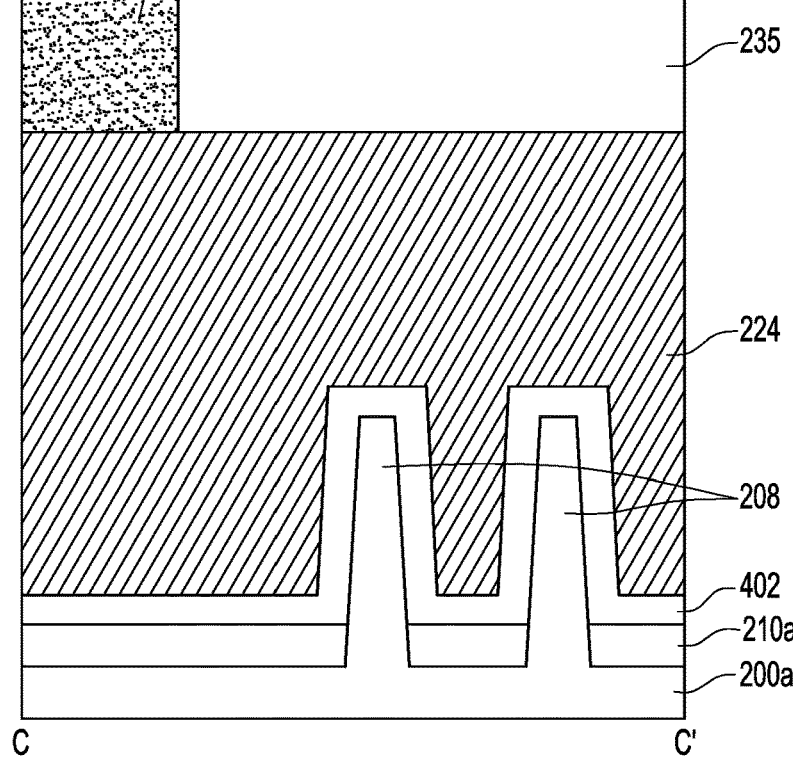
Figure 21C:
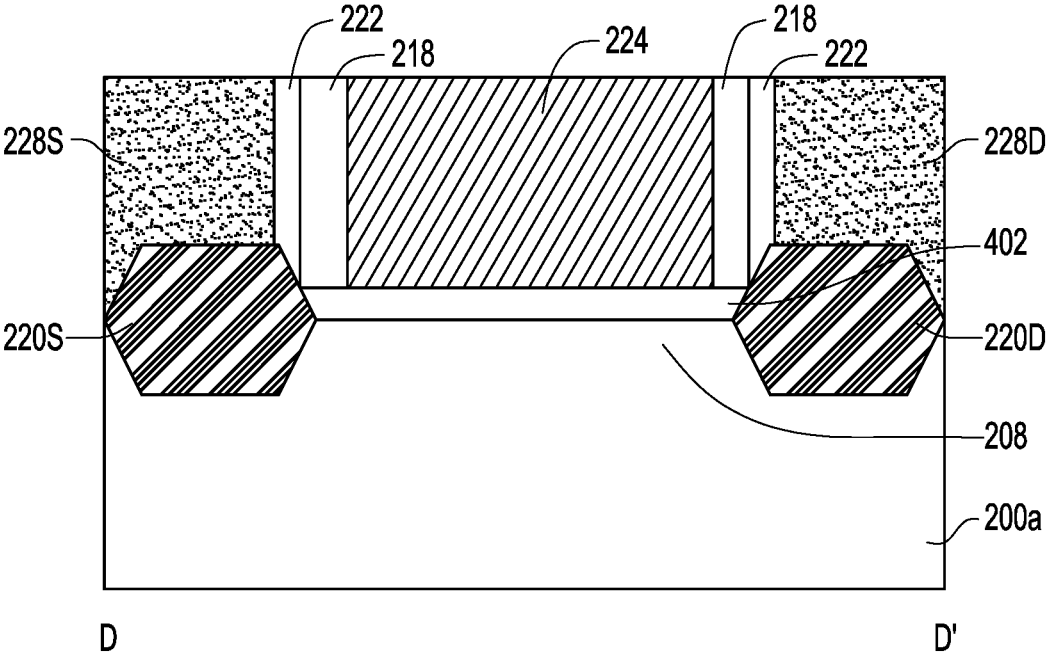

FIG. 21A is a perspective view of the semiconductor device in a logic region at one of various stages of the manufacturing method. FIG. 21B is a sectional view illustrating the semiconductor device of FIG. 21A taken along the line C-C'. FIG. 21C is a sectional view illustrating the semiconductor device of FIG. 21A taken along the line D-D'. The semiconductor device X100 in the logic region shown in FIG. 20A and FIG. 20B may similar to the semiconductor device S100 illustrated in FIG. 12A to FIG. 12C, and may be fabricated using similar methods. Therefore, the same reference numerals are used to refer to the same or liked parts, and its detailed description will be omitted herein. In the exemplary embodiment, the semiconductor device X100 in the logic region may correspond to a logic region in any of the semiconductor devices S100, S200, S300, S400, S500, S600, S700 and S800 described above. In other words, the semiconductor devices S100, S200, S300, S400, S500, S600, S700 and S800 may include a structure shown in FIG. 21A to FIG. 21C in the logic region of the corresponding semiconductor device.

As illustrated in FIG. 21A to FIG. 21C, in the logic region of the semiconductor device X100, a gate dielectric 402 is directly disposed on the semiconductor fins 208, while the second metal layer 224 (gate electrode) is directly disposed on the gate dielectric 402. In the exemplary embodiment, a thickness of the gate dielectric 402 is greater than a thickness of the insulating layer 214 used in the above embodiments. Furthermore, the semiconductor fins 208 in the logic region of the semiconductor device X100 have different heights with the semiconductor fins 208 in the capacitor region. For example, in one embodiment, the semiconductor fins 208 in the logic region of the semiconductor device X100 have a greater height than the semiconductor fins 208 in the capacitor region. In alternative embodiments, the semiconductor fins 208 in the logic region of the semiconductor device X100 have a smaller height than the semiconductor fins 208 in the capacitor region.

According to the above embodiments, the semiconductor device includes at least a capacitor structure having a first metal layer, an insulating layer and a second metal layer in the capacitor region of the semiconductor device. As such, the capacitor structure may be fabricated with improved linearity, uniformity, while having less leakage and high capacitance, and the process window of the semiconductor device can be improved. As such, a problem of low linearity in traditional capacitor structure, and a problem of device leakage and low uniformity due to heavy doping may be resolved.

In accordance with some embodiments of the present disclosure, a semiconductor device includes a substrate having fins and trenches in between the fins, a plurality of insulators, a first metal layer, an insulating layer, a second metal layer and an interlayer dielectric. The insulators are disposed within the trenches of the substrate. The first metal layer is disposed on the plurality of insulators and across the fins. The insulating layer is disposed on the first metal layer over the plurality of insulators and across the fins. The second metal layer is disposed on the insulating layer over the plurality of insulators and across the fins. The interlayer dielectric is disposed on the insulators and covering the first metal layer, the insulating layer and the second metal layer.

In accordance with some other embodiments of the present disclosure, a semiconductor device includes a logic region and a capacitor region. The capacitor region includes a substrate having fins; a first metal layer and a second metal layer disposed on the fins; and at least one insulating layer disposed in between the first metal layer and the second metal layer and on the fins. The logic region includes the substrate having fins; a gate dielectric disposed on the fins, wherein a thickness of the gate dielectric is greater than a thickness of the at least one insulating layer; and a gate electrode disposed on the gate dielectric.

In accordance with yet another embodiment of the present disclosure, a method of fabricating a semiconductor device is described. The method includes the following steps. A substrate is provided. The substrate is patterned to form trenches in the substrate and fins between the trenches. A plurality of insulators is formed in the trenches of the substrate. A first metal layer is formed on the plurality of insulators and across the fins. An insulating layer is formed on the first metal layer and over the plurality of insulators and across the fins. A second metal layer is formed on the insulating layer and over the plurality of insulators and across the fins. An interlayer dielectric is formed on the plurality of insulators and covering the first metal layer, the insulating layer and the second metal layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a substrate having fins and trenches in between the fins;
a plurality of insulators disposed within the trenches of the substrate;
a first metal layer disposed on the plurality of insulators and across the fins;
an insulating layer disposed on the first metal layer over the plurality of insulators and across the fins;
a second metal layer disposed on the insulating layer over the plurality of insulators and across the fins;
an interlayer dielectric disposed on the plurality of insulators and covering the first metal layer, the insulating layer and the second metal layer; and
strained material portions disposed on two opposing sides of the first metal layer, the insulating layer and the second metal layer, wherein top surfaces of the strained material portions are located above top surfaces of the first metal layer and the insulating layer, and a top surface of the second metal layer is located above the top surfaces of the strained material portions.

2. The semiconductor device according to claim 1, wherein the interlayer dielectric is physically contacting sidewalls of the first metal layer, and physically contacting and covering the strained material portions.

3. The semiconductor device according to claim 1, wherein the first metal layer is in physical contact with the strained material portions.

4. The semiconductor device according to claim 1, wherein the first metal layer and the insulating layer is in physical contact with the strained material portions, and the second metal layer is physically separated from the strained material portions by spacer structures.

5. The semiconductor device according to claim 1, further comprising a gate dielectric layer disposed in between the insulating layer and the second metal layer, and across the fins.

6. The semiconductor device according to claim 1, further comprising:
a second insulating layer and a third insulating layer disposed in between the insulating layer and the second metal layer, and across the fins.

7. The semiconductor device according to claim 1, further comprising:

a source contact and a drain contact disposed on two opposing sides of the second metal layer, and wherein the first metal layer is in direct contact with the source contact and the drain contact.

8. The semiconductor device according to claim 1, further comprising:

a second insulating layer disposed on the second metal layer and over the fins;

a third metal layer disposed on the second insulating layer and over the fins;

a third insulating layer disposed on the third metal layer and over the fins; and a fourth metal layer disposed on the third insulating layer and over the fins, wherein the first metal layer and third metal layer are electrically connected to source region materials of the semiconductor device, and the second metal layer and the fourth metal layer are electrically connected to drain region materials of the semiconductor device.

9. A semiconductor device, comprising:

a logic region and a capacitor region, wherein the capacitor region comprises:

a substrate having fins;

a first metal layer and a second metal layer disposed on the fins;

at least one insulating layer disposed in between the first metal layer and the second metal layer and on the fins; and spacer structures disposed on a top surface of the at least one insulating layer, and over a top surface of the first metal layer, and covering sidewalls of the second metal layer;

the logic region comprises:

the substrate having the fins;

a gate dielectric disposed on the fins, wherein a thickness of the gate dielectric is greater than a thickness of the at least one insulating layer; and a gate electrode disposed on the gate dielectric.

10. The semiconductor device according to claim 9, wherein the at least one insulating layer comprises a first insulating layer in contact with the first metal layer, and a gate insulating layer disposed on the first insulating layer and in contact with the second metal layer.

11. The semiconductor device according to claim 10, further comprising a second insulating layer disposed in between the first insulating layer and the gate insulating layer.

12. The semiconductor device according to claim 9, further comprising a source contact and a drain contact disposed on two opposing sides of the second metal layer, wherein the second metal layer is spaced apart from the source contact and the drain contact through the spacer structures.

13. The semiconductor device according to claim 12, wherein the source contact and the drain contact is in physical contact with the first metal layer.

14. The semiconductor device according to claim 12, further comprising strained material portions disposed below the source contact and the drain contact and wherein the at least one insulating layer is physically contacting the strained material portions.

15. The semiconductor device according to claim 9, wherein the fins in the logic region and the fins in the capacitor region have different heights.

16. A method of fabricating a semiconductor device, providing a substrate;

patterning the substrate to form trenches in the substrate and fins between the trenches;

forming a plurality of insulators in the trenches of the substrate;

forming a first metal layer on the plurality of insulators and across the fins;

forming an insulating layer on the first metal layer and over the plurality of insulators and across the fins;

forming a second metal layer on the insulating layer and over the plurality of insulators and across the fins;

forming an interlayer dielectric on the plurality of insulators and covering and contacting sidewalls of the first metal layer and the insulating layer, and physically separated from the second metal layer.

17. The method according to claim 16, further comprising:

forming strained material portions on two opposing sides of the first metal layer, the insulating layer and the second metal layer.

18. The method according to claim 17, wherein the first metal layer is formed to be in physical contact with the strained material portions.

19. The method according to claim 17, wherein the first metal layer and the insulating layer are formed to be in physical contact with the strained material portions, and the second metal layer is formed to be physically separated from the strained material portions by spacer structures.

20. The method according to claim 16, further comprising:

forming a second insulating layer and a third insulator layer in between the insulating layer and the second metal layer, and across the fins.

* * * * *